(12) United States Patent
Tosuke et al.

(10) Patent No.: US 10,243,126 B2
(45) Date of Patent: Mar. 26, 2019

(54) LIGHT EMITTING DEVICE MOUNTING BOARD BLOCK, LIGHT EMITTING DEVICE, AND METHOD OF PRODUCING THE LIGHT EMITTING DEVICE

(71) Applicant: NICHIA CORPORATION, Anan-shi, Tokushima (JP)

(72) Inventors: Hideaki Tosuke, Anan (JP); Hideki Hayashi, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/875,346

(22) Filed: Jan. 19, 2018

(65) Prior Publication Data
US 2018/0212124 A1 Jul. 26, 2018

(30) Foreign Application Priority Data

Jan. 20, 2017 (JP) ................. 2017-008325

(51) Int. Cl.
*H01L 33/62* (2010.01)
*H01L 33/48* (2010.01)
*H01L 33/60* (2010.01)
H01L 29/866 (2006.01)
H01L 25/16 (2006.01)

(52) U.S. Cl.
CPC ............ *H01L 33/62* (2013.01); *H01L 33/483* (2013.01); *H01L 33/60* (2013.01); *H01L 25/167* (2013.01); *H01L 29/866* (2013.01); *H01L 2933/0033* (2013.01); *H01L 2933/0066* (2013.01)

(58) Field of Classification Search
CPC ... H01L 25/167; H01L 33/382; H01L 33/385; H01L 33/54; H01L 33/56; H01L 33/62; H01L 2933/0066; H01L 2933/0033; H01L 2933/0025; H01L 2933/0016; H01L 2933/005
See application file for complete search history.

(56) References Cited

U.S. PATENT DOCUMENTS

| 8,525,208 B2 * | 9/2013 | Kanada ................... H01L 33/60 257/676 |
| 9,698,312 B2 * | 7/2017 | Wakaki ................ H01L 33/486 |
| 2010/0171144 A1 | 7/2010 | Kong et al. |
| 2011/0175127 A1 | 7/2011 | Kanada et al. |
| 2015/0098248 A1 * | 4/2015 | Wakaki ................ F21V 23/001 362/611 |

(Continued)

FOREIGN PATENT DOCUMENTS

| EP | 2082858 A1 | 7/2009 |
| JP | 2009-177093 A | 8/2009 |

(Continued)

*Primary Examiner* — Thanh Y Tran
(74) *Attorney, Agent, or Firm* — Foley & Lardner LLP

(57) ABSTRACT

A light emitting device mounting board block includes: a lead frame having a plate-shape, the lead frame having a first surface, and a second surface located opposite to the first surface; and a resin molded body located on the first surface of the lead frame, the resin molded body having a recessed portion therein. The resin molded body includes a first lateral wall, a second lateral wall, a third lateral wall and a fourth lateral wall, the first and second lateral walls extending in a length direction, the third and fourth lateral walls extending in a width direction.

17 Claims, 12 Drawing Sheets

(56) References Cited

U.S. PATENT DOCUMENTS

2015/0138778 A1   5/2015   Oyama

FOREIGN PATENT DOCUMENTS

| | | |
|---|---|---|
| JP | 2010-034325 A | 2/2010 |
| JP | 2010-530635 A | 9/2010 |
| JP | 2013-153144 A | 8/2013 |
| JP | 2014-123672 A | 7/2014 |
| JP | 2014-207304 A | 10/2014 |
| JP | 2016-162867 A | 9/2016 |
| KR | 10-2008-0062504 A | 7/2008 |
| KR | 10-2008-0089041 A | 10/2008 |
| KR | 10-2015-0062343 A | 6/2015 |

* cited by examiner

LIGHT EMITTING DEVICE MOUNTING BOARD BLOCK, LIGHT EMITTING DEVICE, AND METHOD OF PRODUCING THE LIGHT EMITTING DEVICE

CROSS-REFERENCE TO RELATED APPLICATION

This application claims priority to Japanese Patent Application No. 2017-008325, filed on Jan. 20, 2017, the disclosure of which is hereby incorporated by reference in its entirety.

BACKGROUND

The present disclosure relates to a light emitting device mounting board block, a light emitting device, and a method of producing the light emitting device.

It is known to use, for a backlight unit of a liquid crystal display device, a planar light source including a thin light emitting device and a light guide plate expanding light from the light emitting device in a planar manner. One known light emitting device for such a use is a thin light emitting device including a flat (i.e., low) resin housing (hereinafter, referred to simply as a "housing") and a light emitting diode mounted therein (see, for example, Japanese Patent Publication No. 2010-530635).

SUMMARY

It is desirable to decrease the depth of a thin light emitting device in order to decrease the size and thickness of apparatuses in which a liquid crystal display device is to be mounted.

The foregoing may be achieved by certain embodiments of the present disclosure.

According to one embodiment, a light emitting device mounting board block includes a plate-shaped lead frame having a first surface and a second surface located opposite to the first surface; and a resin molded body provided on the first surface of the lead frame, the resin molded body having a recessed portion provided therein. The resin molded body includes a first lateral wall, a second lateral wall, third lateral wall and a fourth lateral wall; the first and second lateral walls extend in a length direction; the third and fourth lateral walls extend in a width direction; and the recessed portion is enclosed by the first, second, third and fourth lateral walls. The lead frame includes a first support lead partially embedded in the third lateral wall, a first inner lead partially exposed from the resin molded body at a bottom surface of the recessed portion, a first outer lead connected with the first inner lead and extending from the first lateral wall, and a frame connected with the first support lead and the first outer lead; and the first outer lead includes a first portion extending from the first lateral wall in the width direction, and a second portion connected with the first portion and extending in the length direction to be connected with the frame.

In another embodiment, a method of producing a light emitting device includes a step of preparing a light emitting device mounting board block. The light emitting device mounting board block includes a plate-shaped lead frame having a first surface and a second surface located opposite to the first surface; and a resin molded body provided on the first surface of the lead frame, the resin molded body having a recessed portion provided therein. The resin molded body includes a first lateral wall, a second lateral wall, a third lateral wall, and a fourth lateral wall; the first and second lateral walls extend in a length direction; the third and fourth lateral walls extend in a width direction; the recessed portion is enclosed by the first lateral wall, the second lateral wall, the third wall and the fourth lateral wall. The lead frame includes a first support lead partially embedded in the third lateral wall, a first inner lead partially exposed from the resin molded body at a bottom surface of the recessed portion, a first outer lead connected with the first inner lead and extending from the first lateral wall, and a frame connected with the first support lead and the first outer lead; and the first outer lead includes a first portion extending from the first lateral wall in the width direction, and a second portion connected with the first portion and extending in the length direction to be connected with the frame. The method further includes steps of mounting a light emitting element on the first surface of the first inner lead; and locating a support member supporting the first portion and the second portion of the first outer lead each in contact therewith, and cutting the lead frame at a first connection position at which the second portion of the first outer lead is connected with the frame.

According to another embodiment, a light emitting device includes a package including a first lead electrode having a first surface and a second surface located opposite to the first surface, a plating layer covering the first surface and the second surface of the first lead electrode, and a resin molded body provided on the first surface of the first lead electrode, the resin molded body having a recessed portion provided therein; and a light emitting element located in the recessed portion of the package. The resin molded body includes a first lateral wall, a second lateral wall, third lateral wall, a fourth lateral wall, and a third surface, the first and second lateral walls extending in a length direction, the third and fourth lateral walls extending in a width direction, the third surface having an opening of the recessed portion formed therein; and the recessed portion is enclosed by the first, second, third and fourth lateral walls. The first lead electrode includes a first inner lead partially exposed from the resin molded body at a bottom surface of the recessed portion, and a first outer lead connected with the first inner lead and extending from the first lateral wall; the first outer lead includes a first portion facing the first lateral wall and a second portion facing the third lateral wall; and the second portion of the first outer lead has a first end surface positioned at the third lateral wall side, the first end surface being covered with the plating layer, and the second portion of the first outer lead has a second end surface positioned at the second lateral wall side, the second end surface being exposed from the plating layer.

The light emitting device mounting board block, the light emitting device and the method of producing the light emitting device according to the present disclosure can provide a light emitting device having a short depth.

DETAILED DESCRIPTION

Figure 1:
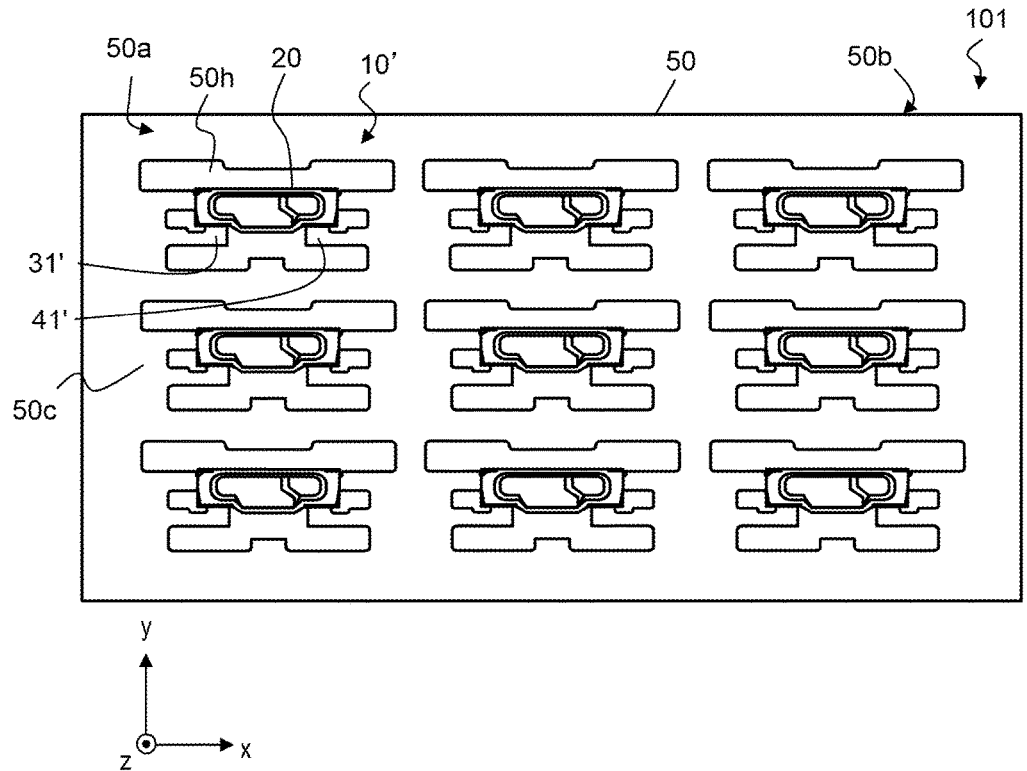
FIG. 1 is a front view illustrating a light emitting device mounting board block in a certain embodiment.

Hereinafter, a light emitting device mounting board block, a light emitting device, and a method of producing the light emitting device of the present disclosure will be described in detail with reference to the drawings. The following embodiments are merely examples, and the light emitting device mounting board block, the light emitting device, and method of producing the light emitting device of the present disclosure are not limited to those described below. In the following description, the size, the positional relationship or the like of components shown in the drawings may be exaggerated for easier understanding and may not reflect the sizes, or the relative sizes between the components, in an actual planar light emitting device. In this disclosure, the expression that "extend in a predetermined direction" encompasses a case in which a component of interest is parallel to the predetermined direction and also a case in which the component of interest has an angle of about 0 degrees to ±5 degrees with respect to the predetermined direction, unless otherwise specified.

Light Emitting Device Mounting Board Block

Figure 2A:
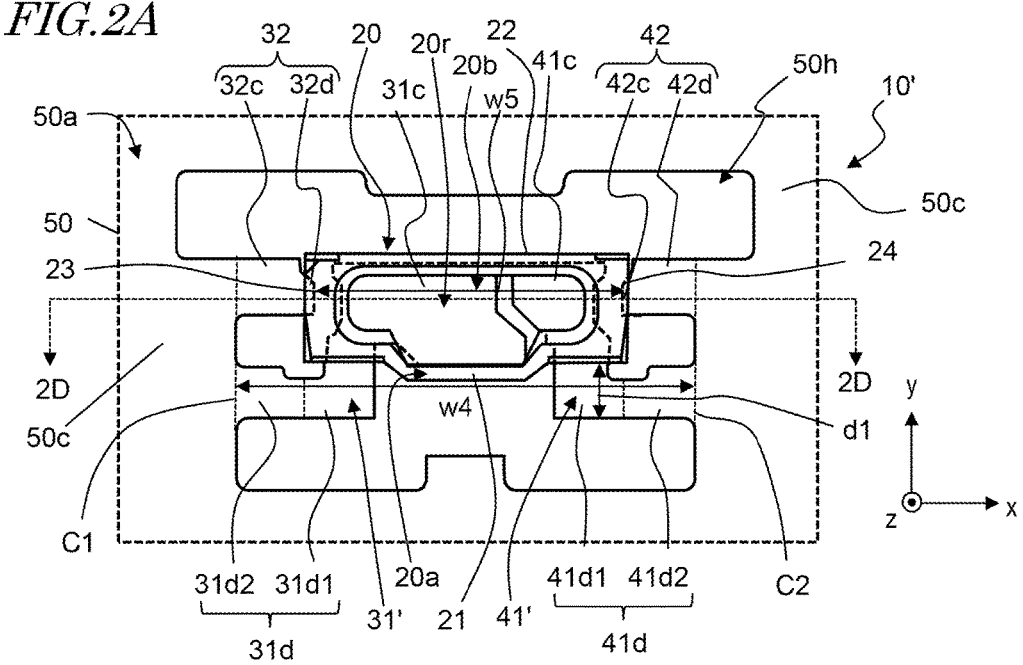
FIG. 2A is a front view illustrating one package member in the light emitting device mounting board block.
Figure 2B:
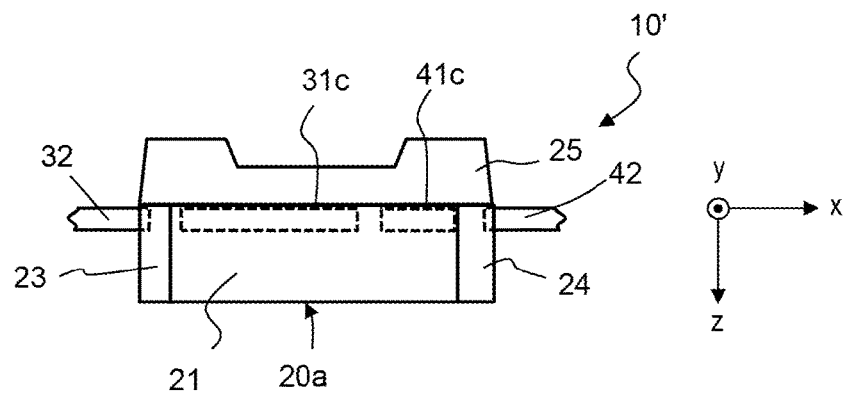
FIG. 2B is a top view of one package member in the light emitting device mounting board block.
Figure 2C:
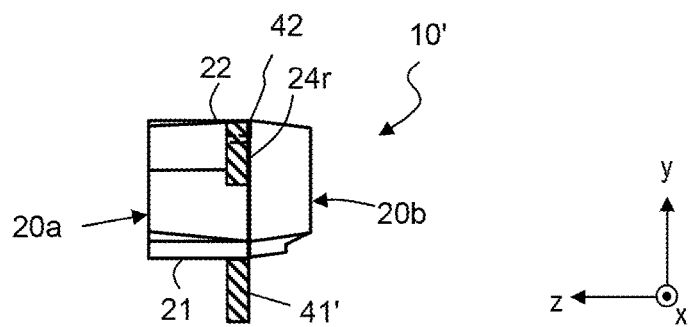
FIG. 2C is a side view of one package member in the light emitting device mounting board block.
Figure 2D:
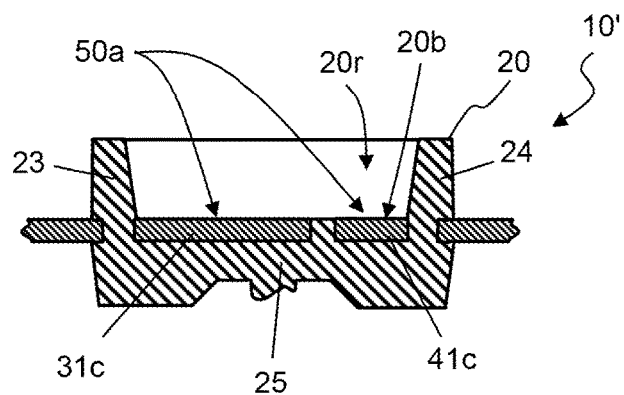
FIG. 2D is a cross-sectional view of the package member taken along line 2D-2D in FIG. 2A.

A light emitting device mounting board block for a light emitting device in an embodiment according to the present disclosure will be described. The light emitting device mounting board block for a light emitting device includes a plurality of package members that are to becomes a package for a light emitting device according to the present disclosure (shown in FIG. 5A). The light emitting device will be described in detail below. FIG. 1 is a front view of a light emitting device mounting board block 101 for a light emitting device (hereinafter, referred to as a "light emitting device mounting board block 101). FIG. 2A is a front view illustrating one package member 10' (more specifically, the region of the package member 10') in the light emitting device mounting board block 101. FIG. 2B and FIG. 2C are respectively a top view and a side view of the package member 10'. FIG. 2D is a cross-sectional view of the package member 10' taken along line 2D-2D in FIG. 2A.

The light emitting device mounting board block 101 includes a lead frame 50 and a plurality of resin molded bodies 20. The package member 10' includes the resin molded body 20, a first lead electrode portion 31' and a second lead electrode portion 41', which are each a portion of the lead frame 50. The package member 10' is cut off from the lead frame 50, and the first lead electrode portion 31' and the second lead electrode portion 41' are bent. As a result, a package 10 usable for a light emitting device is provided. Hereinafter, each of the components will be described in detail.

Lead Frame 50

The lead frame 50 is plate-shaped, and includes a first surface 50a and a second surface 50b opposite to the first surface 50a. The lead frame 50 includes a plurality of openings 50h extending from the first surface 50a to the second surface 50b, and a frame 50c around the openings 50h.

As shown in FIG. 1, an x axis, a y axis and a z axis are defined for the lead frame 50. In an x-y plane, the resin molded body 20 has a shape longer in an x-axis direction than in a y-axis direction. Therefore, hereinafter, the x-axis direction will be referred to as a "length direction", and the y-axis direction will be referred to as a "width direction". A z-axis direction will be referred to as a "depth direction". In the lead frame 50, the plurality of openings 50h are arrayed in the length direction and the width direction. In FIG. 1, three openings 50h are arrayed in the length direction, and three openings 50h are arrayed in the width direction. However, the number of the openings 50h arrayed in each of the length direction and the width direction is not limited to this, and may be determined appropriately.

Figure 3A:
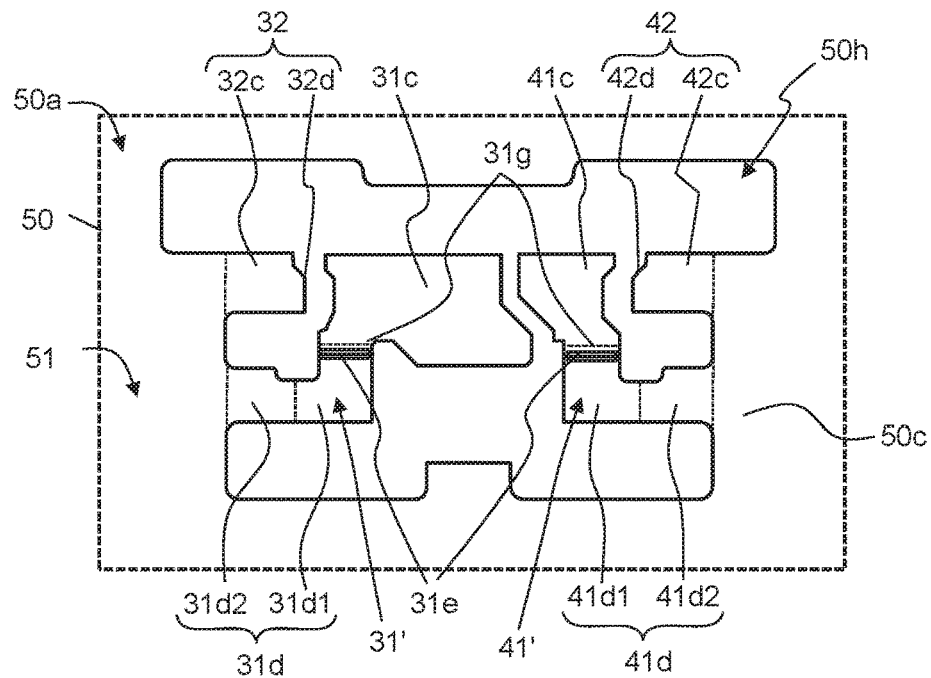
FIG. 3A is a front view illustrating a lead frame in the package member.
Figure 3B:
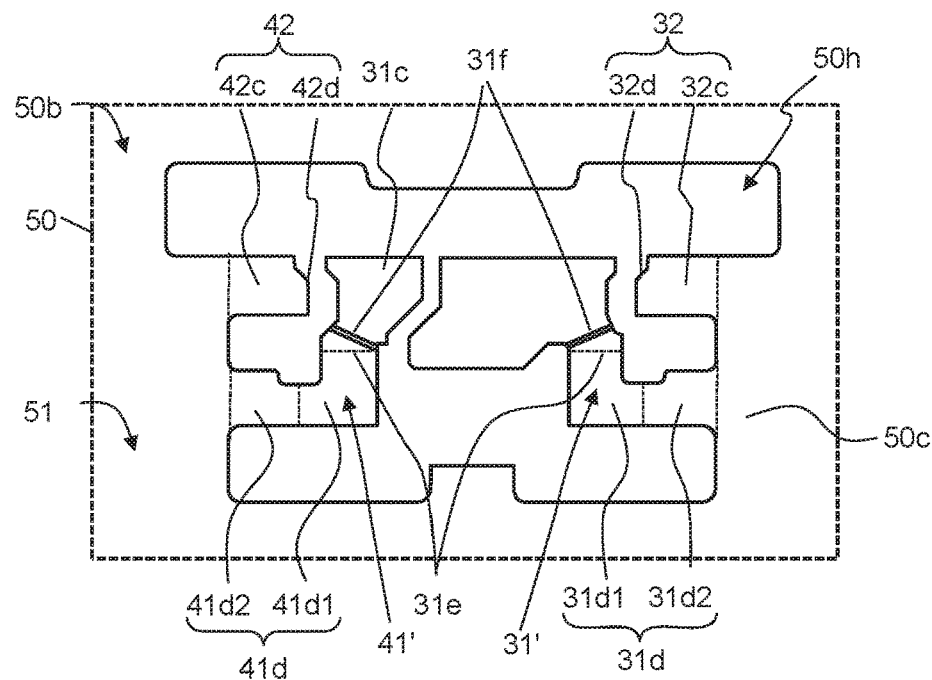
FIG. 3B is a rear view of the lead frame in the package member.
Figure 4A:
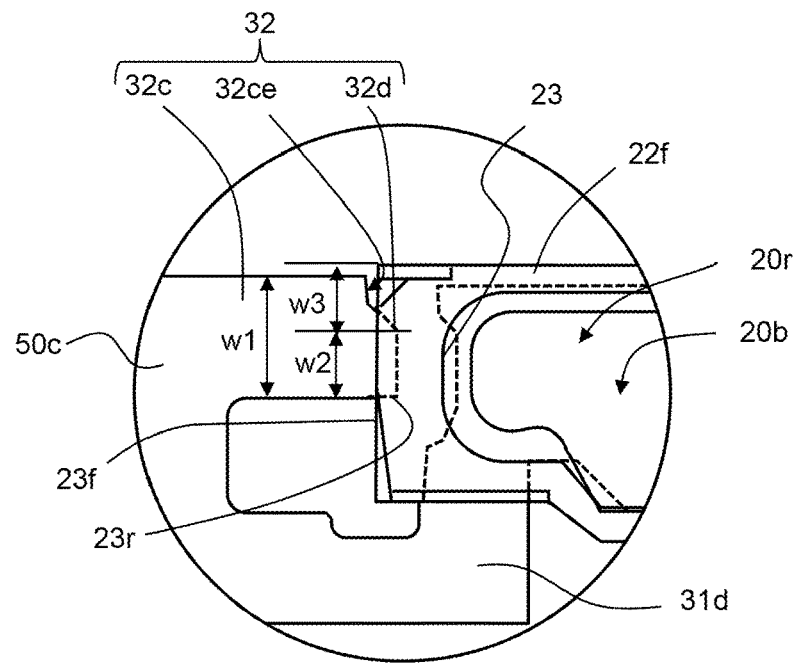
FIG. 4A is an enlarged front view of a first support lead in the lead frame.
Figure 4B:
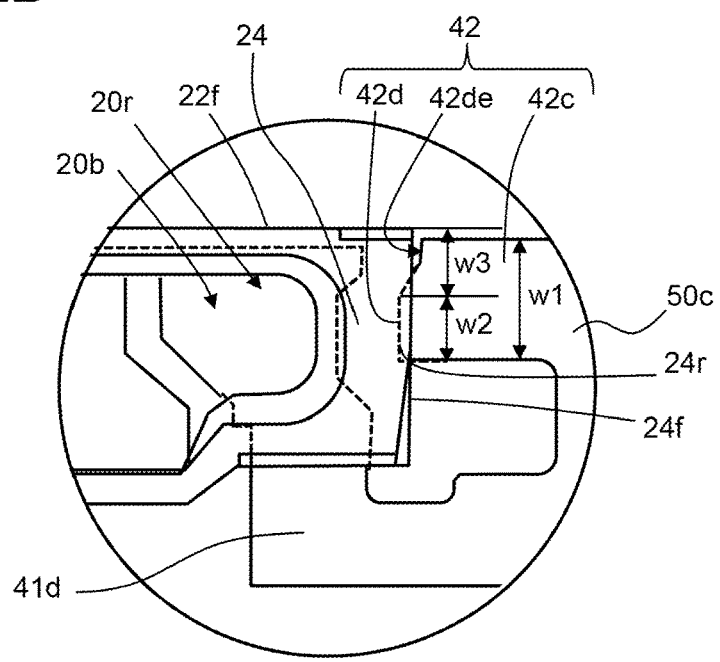
FIG. 4B is an enlarged front view of a second support lead in the lead frame.

FIG. 3A and FIG. 3B are respectively a front view and a rear view of the lead frame 50 of the package members 10'. FIG. 4A is an enlarged front view of a first support lead 32 of the lead frame 50, and FIG. 4B is an enlarged front view of a second support lead 42 of the lead frame 50. As shown in FIG. 3A, the first support lead 32, the second support lead 42, the first lead electrode portion 31' and the second lead electrode portion 41' extend from the frame 50c into the opening 50h.

First Support Lead 32 and Second Support Lead 42

The first support lead 32 and the second support lead 42 detachably support the resin molded body 20 (FIG. 2A). The first support lead 32 and the second support lead 42 are respectively connected with portions of the frame 50c that have the opening 50h therebetween in the length direction. The first support lead 32 and the second support lead 42 extend in the length direction while facing each other with the resin molded body 20 being provided therebetween.

As shown in FIG. 4A, the first support lead 32 includes a base portion 32c connected with the frame 50c and extending in the length direction, and a protrusion portion 32d positioned at a tip of the base portion 32c of the first outer lead 31 side. The base portion 32c and the protrusion portion 32d respectively have width w1 and width w2 in the width direction. Width w2 is smaller than width w1. As described below, a portion of the protrusion portion 32d is embedded in the resin molded body 20 in a detachable manner.

Similarly, as shown in FIG. 4B, the second support lead 42 includes a base portion 42c connected with the frame 50c and extending in the length direction, and a protrusion portion 42d located at a tip of the base portion 42c. The base portion 42c and the protrusion portion 42d respectively have width w1 and width w2 in the width direction. Width w2 is smaller than width w1. As described below, the protrusion portion 42d is embedded in the resin molded body 20 in a detachable manner.

First Lead Electrode Portion 31' and Second Lead Electrode Portion 41'

The first lead electrode portion 31' and the second lead electrode portion 41' are terminals supplying electric power to a light emitting element accommodated in the package from outside. The first lead electrode portion 31' and the second lead electrode portion 41' are respectively connected with the portions of the frame 50c that have the opening 50h therebetween in the length direction.

The first lead electrode portion 31' includes a first inner lead 31c and the first outer lead 31d. The first outer lead 31d includes a first portion 31d1 and a second portion 31d2. The first inner lead 31c is embedded in the resin molded body 20 (FIG. 2A), and is partially exposed at a bottom surface of a recessed portion 20r of the resin molded body 20 described below. The first inner lead 31c is partially located between the first support lead 32 and the second support lead 42.

The first portion 31d1 of the first outer lead 31d is adjacent to the first inner lead 31c in the width direction, and is connected with the first inner lead 31c. The second portion 31d2 is adjacent to the first portion 31d1 in the length direction, and is connected with the first portion 31d1. The second portion 31d2 extends in the length direction and is connected with the frame 50c. Namely, an end of the second portion 31d2 in the length direction is connected with the first portion 31d1, and the other end of the second portion 32d2 in the length direction is connected with the frame 50c.

As shown in FIG. 3A, a first groove 31e is formed in a first surface 50a of the first inner lead 31c. The first groove 31e is formed at a position to be covered with the resin molded body 20. The provision of the first groove 31e can increase the area size in which the resin molded body 20 and the first inner lead 31c contact each other. Therefore, the adhesiveness between the resin molded body 20 and the first inner lead 31c can be improved.

As shown in FIG. 3B, a second groove 31f is formed in the second surface 50b of the first inner lead 31c. The second groove 31f is formed at a position to be covered with the resin molded body 20. The provision of the second groove 31f can increase the area size in which the resin molded body 20 and the first inner lead 31c contact each other. Therefore, the adhesiveness between the resin molded body 20 and the first inner lead 31c can be improved.

The second lead electrode portion 41' includes a second inner lead 41c and a second outer lead 41d. The second lead electrode portion 41' may have substantially the same structure as that of the first lead electrode portion 31' except that the shape and the area size of the second inner lead 41c are different from those of the first inner lead 31c. The second outer lead 41d includes a third portion 41d1 and a fourth portion 41d2. The second inner lead 41c is embedded in the resin molded body 20, and is partially exposed at the bottom surface of the recessed portion 20r of the resin molded body 20 described below. The second inner lead 41c is partially located between the first support lead 32 and the second support lead 42.

The third portion 41d1 of the second outer lead 41d is adjacent to the second inner lead 41c in the width direction, and is connected with the second inner lead 41c. The fourth portion 41d2 is adjacent to the third portion 41d1 in the length direction, and is connected with the third portion 41d1. The fourth portion 41d2 extends in the length direction and is connected with the frame 50c. Namely, an end in the length direction of the fourth portion 41d2 is connected with the third portion 41d1, and the other end in the length direction of the fourth portion 41d2 is connected with the frame 50c.

As shown in FIG. 3A, a first groove 31e is formed in the first surface 50a of the second inner lead 41c. The first groove 31e is formed at a position to be covered with the resin molded body 20. The provision of the first groove 31e can increase the area size in which the resin molded body 20 and the second inner lead 41c contact each other. Therefore, the adhesiveness between the resin molded body 20 and the second inner lead 41c can be improved.

As shown in FIG. 3B, a second groove 31f is formed in the second surface 50b of the second inner lead 41c. The second groove 31f is formed at a position to be covered with the resin molded body 20. The provision of the second groove 31f can increase the area size in which the resin molded body 20 and the second inner lead 41c contact each other. Therefore, the adhesiveness between the resin molded body 20 and the second inner lead 41c can be improved.

Materials of the Lead Frame 50

A base member of the lead frame 50 may be a plate-shaped member obtained as follows. A flat plate of a metal material such as copper, aluminum, gold, silver, tungsten, iron, nickel, cobalt, molybdenum or the like or an alloy thereof is subjected to any of various types of processing such as pressing (encompassing punching), etching, rolling or the like. The lead frame 50 may have a layered structure of any of such metal materials and alloys thereof, but it is simple and preferred that the lead frame 50 is of a single layer. It is especially preferred that the lead frame 50 is formed of a copper alloy (phosphor bronze, iron-containing, etc.) mainly containing copper due to the good heat dissipation property and electrical conductivity.

The first surface 50a and the second surface 50b of the lead frame 50 are preferably covered with a plating layer 51 formed of silver, a silver alloy or the like, which has a high reflectance. It is preferred that lateral surfaces (i.e., end surfaces) between the first surface 50a and the second surface 50b of the first lead electrode portion 31' and the second lead electrode portion 41' are also each covered with a plating layer 51 formed of silver, a silver alloy or the like. With such an arrangement, even if the base material of the lead frame 50 has a low reflectance, light from the light emitting element can be reflected by silver, a silver alloy or the like having a high reflectance. Therefore, the light extraction efficiency of the light emitting device can be improved.

The lead frame 50 may have a thickness appropriately selected in accordance with the characteristics or mass-productivity of the light emitting device. For example, the thickness of the lead frame 50 may be 0.05 mm or greater and 1 mm or less, is preferably 0.07 mm or greater and 0.3 mm or less, and is more preferably 0.1 mm or greater and 0.2 mm or less. The thickness of the lead frame 50 may be substantially the same entirely, or may be partially different. In the case in which the thickness of the lead frame 50 is partially different, it is preferred that among the first outer lead 31*d* of the first lead electrode portion 31' and the second outer lead 41*d* of the second lead electrode portion 41', a portion to be bent along the outer profile of the resin molded body 20 is thinner. With such an arrangement, the first lead electrode portion 31' and the second lead electrode portion 41' can be easily bent. Among the first outer lead 31*d* of the first lead electrode portion 31' and the second outer lead 41*d* of the second lead electrode portion 41', by making only the portion to be bent and the vicinity thereof thinner, twisting of the lead frame 50 is alleviated relative to the case in which the entire thickness of the lead frame 50 is substantially uniformly thin.

Resin Molded Body 20

The resin molded body 20 is a base member of a container of the package member 10', and forms a portion of the outer shape of the package 10. As shown in FIG. 2A through FIG. 2D, the resin molded body 20 is partially formed on the first surface 50*a* of the lead frame 50. More specifically, the resin molded body 20 is formed in the opening 50*h* of the lead frame 50 so as to encapsulate the first inner lead 31*c* and the second inner lead 41*c*.

The resin molded body 20 includes the recessed portion 20*r* having an opening in a front surface 20*a* (i.e., third surface). The recessed portion 20*r* is enclosed by four lateral walls. Specifically, the resin molded body 20 has a first lateral wall 21, a second lateral wall 22, a third lateral wall 23, a fourth lateral wall 24, and a rear portion 25. The first lateral wall 21, the second lateral wall 22, the third lateral wall 23 and the fourth lateral wall 24 surround the recessed portion 20*r*. The rear portion 25 is located on a bottom side of the recessed portion 20*r*. The resin molded body 20 may be, for example, generally rectangular-parallelepiped or may have a shape close thereto. The resin molded body 20 has a generally rectangular-parallelepiped shape in which the length in the length direction (i.e., x-axis direction) is greater than that in the width direction (i.e., y-axis direction) and the length in the width direction is longer than that in the depth direction (i.e., z-axis direction). The package member 10' including the resin molded body 20 having such a shape is usable for a light emitting device of, for example, a side-emitting type (also referred to as a "side view type").

The first lateral wall 21 and the second side view 22 extend in the length direction, and face each other while having the recessed portion 20*r* therebetween. The third lateral wall 23 and the fourth lateral wall 24 extend in the width direction, and face each other while having the recessed portion 20*r* therebetween.

As shown in FIG. 2A and FIG. 2D, the first surface 50*a* of the first inner lead 31*c* and the first surface 50*a* of the second inner lead 41*c* are partially exposed to the bottom surface (hereinafter, represented by reference numeral 20*b*) of the recessed portion 20*r*. Outer peripheries of the first inner lead 31*c* and the second inner lead 41*c* are partially embedded in the first lateral wall 21, the second lateral wall 22, the third lateral wall 23 and the fourth lateral wall 24.

As shown in FIG. 4A, the protrusion portion 32*d* of the first support lead 32 is partially embedded in the third lateral wall 23. The protrusion portion 32*d* is not exposed to the bottom surface 20*b* of the recessed portion 20*r*. The resin is removed from a portion of the third lateral wall 23 in an area where the protrusion portion 32*d* is located. Therefore, a third recessed portion 23*r* is formed in a third outer side surface 23*f* to correspond to the protrusion portion 32*d*. As shown in FIG. 4A, an end 32*ce* of the base portion 32*c* of the first support lead 32 is away from the third outer side surface 23*f* of the third lateral wall 23.

As shown in FIG. 4B, as in the case of the first support lead 32, the protrusion portion 42*d* of the second support lead 42 is partially embedded in the fourth lateral wall 24. The protrusion portion 42*d* is not exposed to the bottom surface 20*b* of the recessed portion 20*r*. The resin is removed from a portion of the fourth lateral wall 24 in an area where the protrusion portion 42*d* is located. Therefore, a fourth recessed portion 24*r* is formed in a fourth outer side surface 24*f* to correspond to the protrusion portion 42*d*. As shown in FIG. 4B, an end 42*d* of the base portion 42*c* of the second support lead 42 is away from the fourth outer side surface 24*f* of the fourth lateral wall 24.

A distance w3, a distance from an outer surface of the second lateral wall 22 to each of the third recessed portion 23*r* and the fourth recessed portion 24*r*, is preferably as long as possible. With the distance w3 being long, at the time of detaching the package 10 from the lead frame 50, the package 10 is less likely to be cracked by the stress received from the protrusion portion 32*d* of the first support lead 32 and the protrusion portion 42*d* of the second support lead 42. For example, the distance w3 is preferably greater than the thickness of the lead frame 50.

Location of Resin Molded Body 50 in Lead Frame 50

As shown in FIG. 2A, the resin molded body 20 is formed to surround the first inner lead 31*c* of the first lead electrode portion 31' and the second inner lead 41*c* of the second lead electrode portion 41'. The first portion 31*d*1, of the first outer lead 31*d*, connected with the first inner lead 31*c*, and the third portion 41*d*1, of the second outer lead 41*d*, connected with the second inner lead 41*c* extend from the first lateral wall 21 in the width direction. In the first outer lead 31*d* and the second outer lead 41*d*, the second portion 31*d*2 and the fourth portion 41*d*2 are respectively adjacent to, and positioned outside the first portion 31*d*1 and the third portion 41*d*1 in the length direction, and extend in the length direction. The second portion 31*d*2 and the fourth portion 41*d*2 are connected with the frame 50*c* in the length direction. A distance w4 between a first connection position C1, at which the second portion 31*d*2 and the frame 50*c* are connected with each other, and a second connection position C2, at which the fourth portion 41*d*2 and the frame 50*c* are connected with each other is longer than distance w5 between a tip of the first support lead 32 and a tip of the second support lead 42.

The first connection position C1 and the second connection position C2 are respectively in the vicinity of cut off positions at which the first lead electrode portion 31' and the second lead electrode portion 41' are cut off from the frame 50*c* at the time of cutting off the package member 10' from the lead frame 50.

A length d1 is a length in the width direction of the first portion 31*d*1, of the first outer lead 31*d*, extending from the first lateral wall 21 in the width direction in the package member 10'. To shorten the depth of the light emitting device (hereinafter, represented by reference numeral 102) for size reduction, length d1, and a length in the width direction of the third portion 41*d*1, of the second outer lead 41*d* need to be shortened. In the light emitting device mounting board block 101 in this embodiment, the first lead electrode portion 31' and the second lead electrode portion 41' are respectively connected with the frame 50*c* through the second portion 31*d*2 and the fourth portion 41*d*2. Therefore, as described below, a die plate used to cut the first lead electrode portion 31' and the second lead electrode portion 41' can respectively support the second portion 31*d*2 of the first outer lead 31*d* and the fourth portion 41*d*2 of the second outer lead 41*d*. With such an arrangement, even if the area size of the first portion 31*d*1 and the third portion 41*d*1 respectively supported by the die plate is decreased by shortening the depth of the light emitting device 102, the first outer lead 31*d* and the second outer lead 41*d* are stably supported respectively.

Materials of Resin Molded Body 20

A base material of the resin molded body 20 may be, for example, a thermosetting resin or a thermoplastic resin. The resins described below encompass modified resins and hybrid resins thereof. A thermosetting resin is preferable from the standpoints of having high heat resistance and light resistance, a longer service life, and higher reliability than a thermoplastic resin. Examples of the thermosetting resin include epoxy resin, silicone resin, polybismaleimidetriazine resin, polyimide resin, polyurethane resin, unsaturated polyester resin, and the like. Among these resins, any one of epoxy resin, silicone resin and unsaturated polyester resin is preferred. Especially, unsaturated polyester resin, modified resins and hybrid resins thereof have high resistance to heat and light, which are characteristics of the thermosetting resin. Unsaturated polyester resin is also injection-moldable and have high mass-productivity Accordingly, unsaturated polyester resin is preferably used. Specifically, resins described in Japanese Patent Publications Nos. 2013-153144, 2014-207304, 2014-123672 and the like are usable. As the base material of the resin molded body 20, the thermoplastic resin, which costs less than the thermosetting resin, is preferred. Examples of the thermoplastic resin include aliphatic polyamide resin, semi-aromatic polyamide resin, aromatic polyphthalamide resin, polycyclohexylenedimethyleneterephthalate, polyethyleneterephthalate, polycyclohexaneterephthalate, liquid crystal polymer, polycarbonate resin, and the like. Among these resins, any one of aliphatic polyamide resin, polycyclohexaneterephthalate, polycyclohexylenedimethyleneterephthalate is preferred. The resin molded body 20 preferably contains a white pigment and a filler in the base material from the points of view of light reflectance, mechanical strength, thermal elasticity, or the like.

The thermosetting resin such as unsaturated polyester resin, epoxy resin, or the like has characteristics preferred for the resin molded body for the above-described light emitting device 102, but is less viscous than the thermoplastic resin. There is a case in which the flexural modulus of the thermosetting resin is, for example, about 10 GPa or greater, which indicates that the bending resistance is low. With this flexural modulus, the probability is increased for the package 10 to be broken or partially cracked subject to handling or pressure at detachment from the light emitting device mounting board block 101. However, in this embodiment, such breakage of the package 10 can be effectively mitigated even though the thermosetting resin is used.

In the case in which the material of the resin molded body 20 is brittle, the probability becomes high for the resin molded body 20 to be broken. Therefore, in the case in which the flexural modulus of the material of the resin molded body 20 is about 8 GPa or greater, about 10 GPa or greater or about 16 GPa or greater, the effect of this embodiment is especially high.

In the case in which the light emitting device 102 is thin, for example, the light emitting device 102 has a height of about 0.3 mm, thinning of the walls of the resin molded body 20 may decrease the strength, and thus increase the probability that the package 10 is broken. Therefore, even if the material of the resin molded body 20 is a thermoplastic resin having a flexural modulus of about 5 GPa, the effect of this embodiment is especially high in the case in which the light emitting device 102 is thin.

The resin molded body 20 preferably has a light reflectance of 70% or greater at the light emission peak wavelength of a light emitting element used for the light emitting device 102, from the point of view of increasing the light extraction efficiency of the light emitting device 102. In addition, the resin molded body 20 is preferably white. The resin molded body 20 may be put into a fluid state, namely, into a liquid state (encompassing a sol state or a slurry state) before being cured or solidified. The resin molded body 20 may be formed by, for example, injection molding, transfer molding or the like.

The resin molded body 20 preferably contains a white pigment and/or a reinforced fiber. This increases the strength of the resin molded body 20 and decreases the probability of breakage.

Examples of the white pigment include titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, zirconium oxide, and the like. The white pigment may be one of these substances or may contain a combination of two or more of these substances. Among these substances, titanium oxide has a relatively high refractive index and has a good light blocking property and thus is preferred.

Examples of the filler include silicon oxide, aluminum oxide, glass, potassium titanium, calcium silicate (e.g., wollastonite), mica, talc, and the like. The filler may be one of these substances or may contain a combination of two or more of these substances. It should be noted that a different substance needs to be used for the filler from the white pigment. As an agent decreasing the thermal expansion coefficient of the resin molded body 20, silicon oxide is especially preferred. The particle diameter of silicon oxide is preferably 5 μm or greater and 100 μm or less, and more preferably 5 μm or greater and 30 μm or less. As a reinforcing agent, glass, potassium titanium, and calcium silicate (e.g., wollastonite) are preferable. Among these substances, calcium silicate (e.g., wollastonite) and potassium titanate have a relatively short particle diameter, and thus are preferred for the resin molded body 20 being thin or compact. Specifically, the average fiber diameter of the reinforcing agent is appropriately selectable, and is, for example, in a range of from 0.05 μm to 100 μm, preferably in a range of from 0.1 μm to 50 μm, more preferably in a range of from 1 μm to 30 μm, and still more preferably in a range of from 2 μm to 15 μm. The average fiber length of the reinforcing agent is appropriately selectable, and is, for example, in a range of from 0.1 μm to 1 mm, preferably in a range of from 1 μm to 200 μm, more preferably in a range of from 3 μm to 100 μm, and still more preferably in a range of from 5 μm to 50 μm. The average aspect ratio (i.e., average fiber length/average fiber diameter) of the reinforcing agent is appropriately selectable, and is, for example, in a range of from 2 to 300, preferably in a range of from 2 to 100, more preferably in a range of from 3 to 50, and still more preferably in a range of from 5 to 30. The shape of the filler can be appropriately selected. The filler may be irregular (or crushed) shape, but is preferably fiber-like (or needle-like) or plate-shaped (or scaly) shape from the point of view of function as the reinforcing agent, and is preferably spherical shape from the point of fluidity. The content of the filler in the resin molded body 20 may be appropriately determined in consideration of the thermal expansion coefficient, the mechanical strength and the like of the resin molded body 20, and is preferably in a range of from 10 wt. % to 80 wt. %, and more preferably in a range of from 30 wt. % to 60 wt. %. The content of the reinforcing agent is preferably in a range of from 5 wt. % to 30 wt. %, and more preferably in a range of from 5 wt. % to 20 wt. %.

Light Emitting Device

Figure 5A:
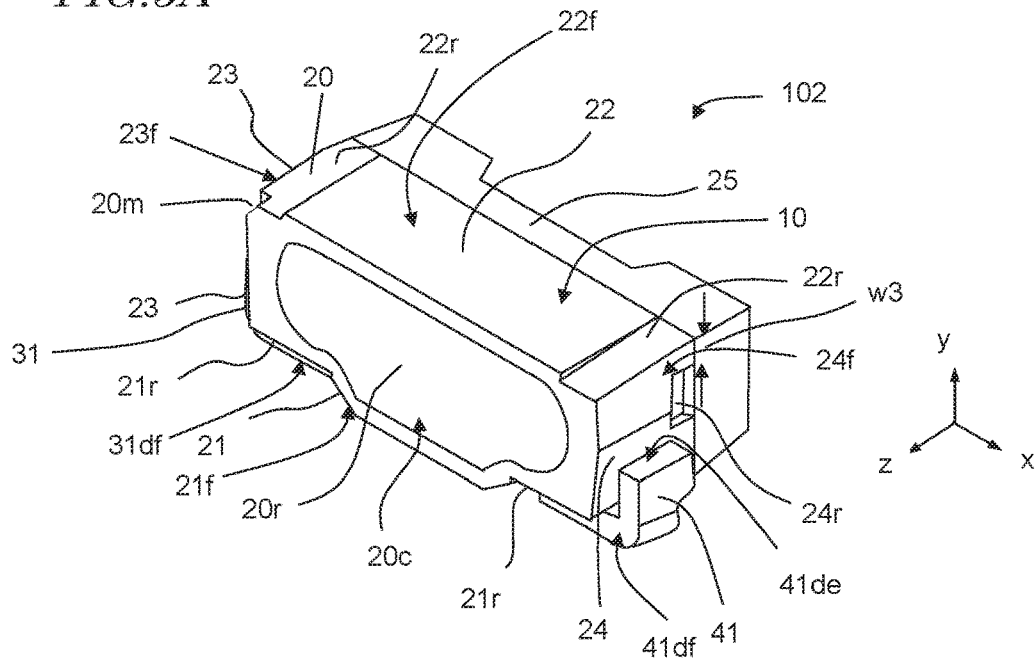
FIG. 5A is a perspective view illustrating a light emitting device in an embodiment.
Figure 5B:
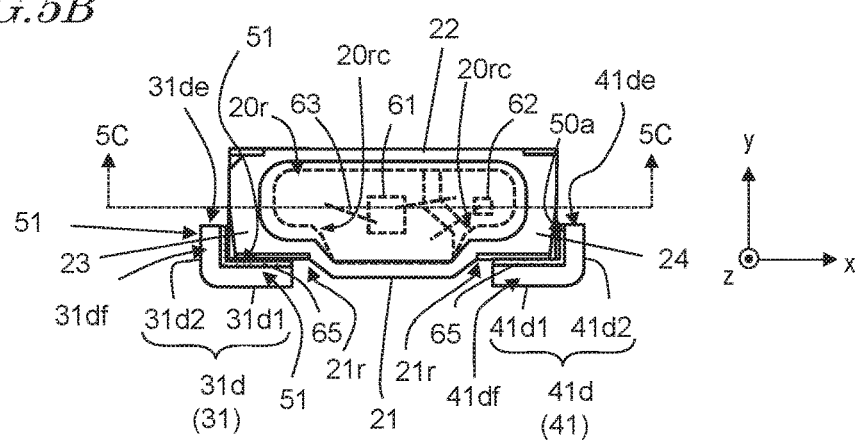
FIG. 5B is a front view of the light emitting device.
Figure 5C:
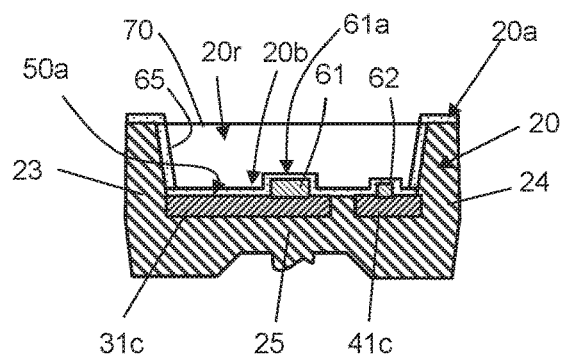
FIG. 5C is a cross-sectional view of the light emitting device taken along line 5C-5C in FIG. 5B.
Figure 5D:
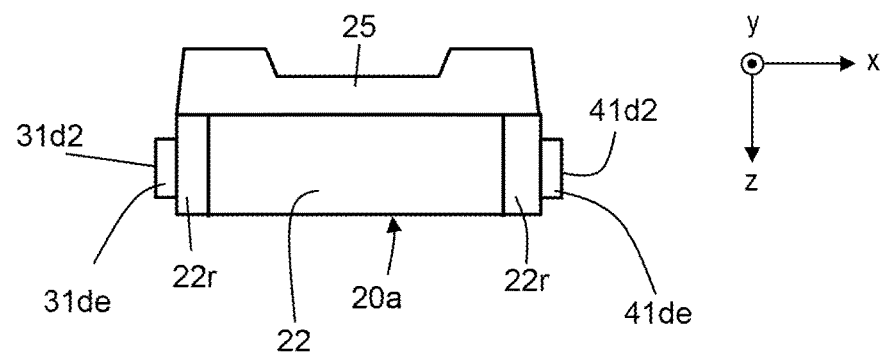
FIG. 5D is a top view of the light emitting device.
Figure 5E:
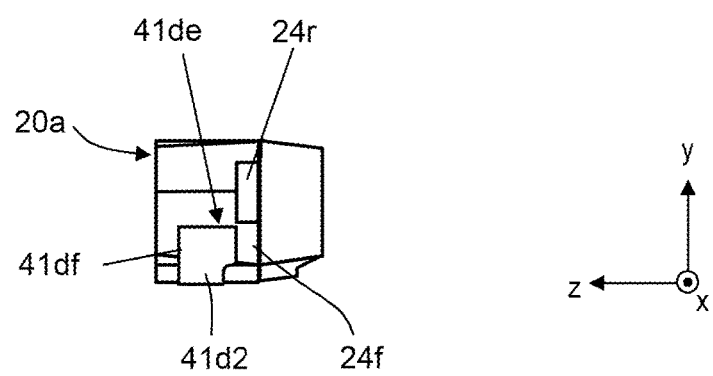
FIG. 5E is a side view of the light emitting device.

An embodiment of the light emitting device 102 according to the present disclosure will be described. FIG. 5A and FIG. 5B are respectively a perspective view and a front view of the light emitting device 102. FIG. 5C is a cross-sectional view of the light emitting device 102 taken along line 5C-5C in FIG. 5B. FIG. 5D and FIG. 5E are respectively a top view and a side view of the light emitting device 102. The light emitting device 102 includes the package 10 and a light emitting element 61.

Package 10

The package 10 includes the resin molded body 20, a first lead electrode 31 and a second lead electrode 41.

The package 10 is different from the package member 10' in that the package 10 is formed by use of the package member 10' supported by the light emitting device mounting board block 101 and detached from the lead frame 50, and that the first lead electrode portion 31' and the second lead electrode portion 41' are bent. For this reason, components of the package 10 that are common to those of the package member 10' will bear the same reference signs, and the descriptions on the package member 10' may be incorporated therein or may be referred to.

Resin Molded Body 20

The resin molded body 20 has the same structure as the resin molded body 20 in the package member 10'. Specifically, the resin molded body 20 includes the first lateral wall 21, the second lateral wall 22, the third lateral wall 23, the fourth lateral wall 24 and the rear portion 25. In the resin molded body 20, the recessed portion 20r having the first lateral wall 21, the second lateral wall 22, the third lateral wall 23 and the fourth lateral wall 24 as lateral walls and having the rear portion 25 as a portion of the bottom surface 20b is formed.

There is no specific limitation on the shape, size, depth, or the like of the recessed portion 20r as long as the light emitting element 61, and wires 63, and the like described below are allowed to be accommodated in the recessed portion 20r. For example, the recessed portion 20r may have an elliptical shape, a square shape or a shape close thereto as seen in a front view. It is preferred that the width of the recessed portion 20r in the length direction is greater than the width thereof in the width direction. With such an arrangement, the portion where the light is output is enlarged. Thus, the light emitting device 102 is made thinner while the light extraction efficiency is increased. It is preferred that the recessed portion 20r has a shape close to the shape of the front surface 20a (i.e., third surface) of the resin molded body 20. For example, as shown in FIG. 5B, the first lateral wall 21 of the light emitting device 102 in this embodiment may include a protrusion portion 20c. With such an arrangement, the portion where the light is extracted from the light emitting element 61 (i.e., light emitting surface) is enlarged, and the light extraction efficiency of the light emitting device 102 can be increased.

As shown in, for example, FIG. 5C, it is preferred that inner side surfaces of the recessed portion 20r are inclined such that the width thereof in the length direction and the width direction increases from the bottom surface 20b of the recessed portion 20r toward the front surface 20a of the resin molded body 20. With such an arrangement, the light emitted from the light emitting element 61 is reflected by the inner side surfaces of the recessed portion 20r, and is extracted toward the front surface 20a efficiently. In the case in which a encapsulant 70 described below is provided in the recessed portion 20r, the inner side surfaces of the recessed portion 20r, namely, the inner side surfaces of the resin molded body 20 may be roughened by embossing, plasma treatment, or the like as long as the resin molded body 20 is ensured to have a certain strength, in order to improve the adhesiveness between the resin molded body 20 and the encapsulant 70.

In the case in which the light emitting device 102 includes a protective layer 65 described below, it is preferred that a corner 20rc between the inner side surfaces and the bottom surface 20b of the recessed portion 20r is curved. The protective layer 65 may be a film of silicon oxide or the like and cover, for example, the first surface 50a of the first inner lead 31c and the first surface 50a of the second inner lead 41c. Having the corner 20rc between the inner side surfaces and the bottom surface 20b of the recessed portion 20r curved, even if the first outer lead 31d and the second outer lead 41d are bent as described below, stress concentration on the corner between the inner side surfaces and the bottom surface 20b of the recessed portion 20r can be mitigated. Thus, the protective layer 65 is less likely to be cracked.

As shown in FIG. 5A, the first lateral wall 21, the second lateral wall 22, the third lateral wall 23 and the fourth lateral wall 24 respectively include a first outer side surface 21f, a second outer side surface 22f, the third outer side surface 23f and the fourth outer side surface 24f opposite to the inner side surfaces of the recessed portion 20r. These outer side surfaces may each be formed of single plane or a plurality of planes. These outer side surfaces may include single or a plurality of curved surfaces. The resin molded body 20 may include a mark 20m representing the polarity of the electrodes.

In this embodiment, the first outer side surface 21f has two first recessed portions 21r formed therein at positions close to the third outer side surface 23f and the fourth outer side surface 24f in the length direction. As shown in FIG. 5B, the first recessed portions 21r are used as spaces in which the first lead electrode 31 and the second lead electrode 41 are partially accommodated in a bent state.

The second outer side surface 22f has two second recessed portions 22r formed therein at positions close to the third outer side surface 23f and the fourth outer side surface 24f in the length direction. The second recessed portions 22r are used as inclining portions allowing the resin molded body 20 to be easily removed from a molding die.

The third outer side surface 23f and the fourth outer side surface 24f respectively have the third recessed portion 23r and the fourth recessed portion 24r formed therein. The third recessed portion 23r and the fourth recessed portion 24r are respectively portions where a portion of the protrusion portion 32d of the first support lead 32 and a portion of the protrusion portion 42d of the second support lead 42 have been inserted.

As described above, the third recessed portion 23r and the fourth recessed portion 24r are away from the second outer side surface 22f by, specifically, the distance w3. As described above, especially in the case in which the distance w3 is greater than the thickness of the lead frame 50, the package 10 is less likely to be cracked by the stress received from the protrusion portion 32d of the first support lead 32 and the protrusion portion 42d of the second support lead 42 at the time of being detached from the lead frame 50. The third recessed portion 23r and the fourth recessed portion 24r are also away from the first outer side surface 21f.

First Lead Electrode 31 and Second Lead Electrode 41

Figure 6A:
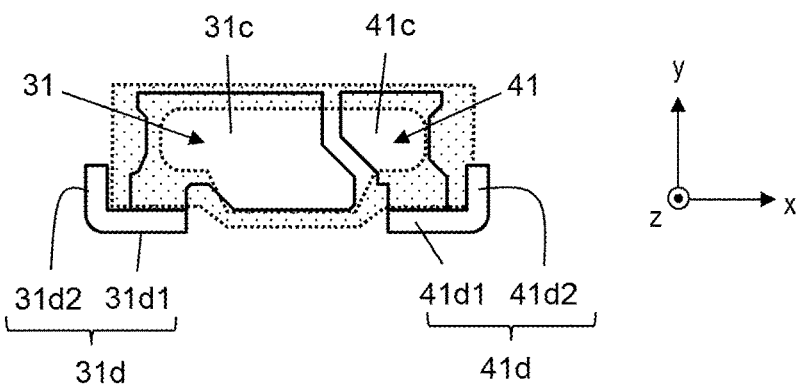
FIG. 6A is a front view of a first lead electrode and a second lead electrode.
Figure 6B:
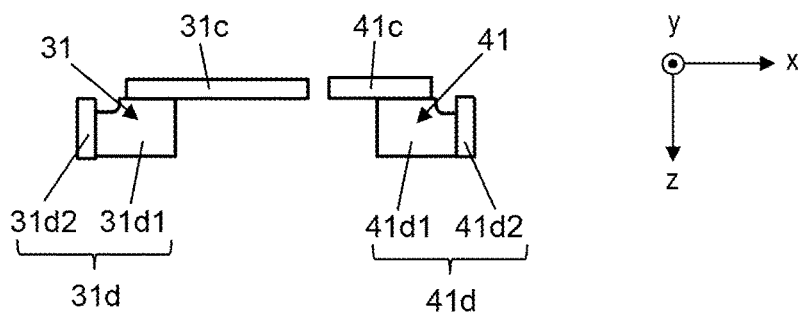
FIG. 6B is a top view of the first lead electrode and the second lead electrode.
Figure 6C:
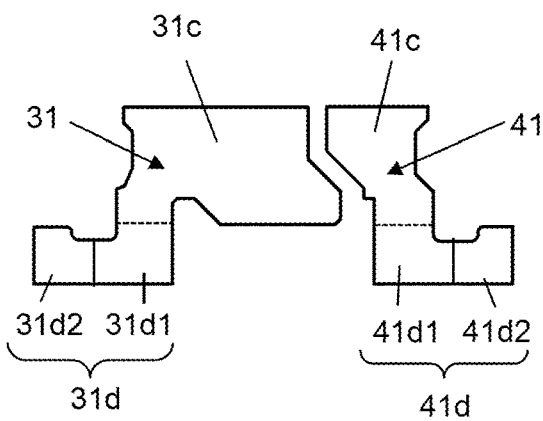
FIG. 6C is a front view of the first lead electrode and the second lead electrode in a pre-bending state.

FIG. 6A and FIG. 6B are respectively a front view and a top view of the first lead electrode 31 and the second lead electrode 41. FIG. 6C is a front view of the first lead electrode 31 and the second lead electrode 41 before the first lead electrode 31 and the second lead electrode 41 are bent. In FIG. 6A, the region of the resin molded body 20 is represented by hatching.

As well as the first lead electrode portion 31', the first lead electrode 31 includes the first inner lead 31c and the first outer lead 31d including the first portion 31d1 and the second portion 31d2. In the first lead electrode 31, the first portion 31d1 of the first outer lead 31d is bent at an angle of about 90 degrees with respect to the first inner lead 31c. The second portion 31d2 is bent at an angle of about 90 degrees with respect to the first portion 31d1. Similarly, the third portion 41d1 of the second outer lead 41d is bent at an angle of about 90 degrees with respect to the second inner lead 41c. The fourth portion 41d2 is bent at an angle of about 90 degrees with respect to the third portion 41d1.

Therefore, as shown in FIG. 5B, the first portion 31d1 of the first outer lead 31d and the third portion 41d1 of the second outer lead 41d extend from the first lateral wall 21 toward the front surface 21a and face the first lateral wall 21. More specifically, the first surfaces 50a of the first portion 31d1 and the third portion 41d1 face the first outer side surface 21f of the first lateral wall 21. The second portion 31d2 of the first outer lead 31d and the fourth portion 41d2 of the second outer lead 41d respectively face the third lateral wall 23 and the fourth lateral wall 24. More specifically, the first surfaces 50a of the second portion 31d2 and the fourth portion 41d2 respectively face the third outer side surface 23f of the third lateral wall 23 and the fourth outer side surface 24f of the fourth lateral wall 24.

A second end surface 31de of the second portion 31d2 of the first outer lead 31d is formed as a result of the second portion 31d2 being cut from the frame 50c of the lead frame 50. Therefore, the second end surface 31de does not include plating layer 51 thereon, and is exposed from the plating layer 51. By contrast, the first surfaces 50a and the second surfaces 50b of the first portion 31d1 and the second portion 31d2 are each covered with the plating layer 51. A first end surface 31df of the first portion 31d1 and the second portion 31d2 facing the front surface 20a side is also covered with the plating layer 51. The first end surface 31df faces the front surface 20a side in the z-axis direction, and the second end surface 31de faces the second lateral wall 22 side in the y-axis direction.

Likewise, a second end surface 41de of the fourth portion 41d2 of the second outer lead 41d is formed as a result of the fourth portion 41d2 being cut from the frame 50c of the lead frame 50. Therefore, the second end surface 41de does not include plating layer 51 thereon, and is exposed from the plating layer 51. By contrast, the first surfaces 50a and the second surfaces 50b of the third portion 41d1 and the fourth portion 41d2 are each covered with the plating layer 51. A first end surface 41df of the third portion 41d1 and the fourth portion 41d2 facing the front surface 20a is also covered with the plating layer 51. The first end surface 41df faces the front surface 20a side in the z-axis direction, and the second end surface 41de faces the second lateral wall 22 side in the y-axis direction.

Light Emitting Element 61

The light emitting element 61 may be a semiconductor light emitting element such as a light emitting diode element (i.e., LED) or the like. In many cases, the light emitting element 61 includes a substrate. The light emitting element 61 may employ an element formed of any of various semiconductors and a pair of positive and negative (i.e., pn) electrodes. Specifically, a light emitting element of a nitride semiconductor ($In_xAl_yGa_{1-x-y}N$, $0 \leq x$, $0 \leq y$, $x+y \leq 1$) capable of emitting light in the range of ultraviolet light to visible light is usable for the light emitting element 61. Alternatively, the light emitting element 61 may be a light emitting element of a gallium phosphide-based semiconductor capable of emitting light in the range of green light to red light. In the case in which the light emitting element 61 includes a pair of positive and negative electrodes provided on the same surface, the electrodes are respectively connected with the first inner lead 31c of the first lead electrode 31 and the second inner lead 41c of the second lead electrode 41 via wires 63 (shown in FIG. 5B). Alternatively, the positive and negative electrodes may be connected with the first inner lead 31c and the second inner lead 41c via a conductive adhesive (referred to as "flip-chip mounting"). In the case in which the light emitting element 61 has opposed-sided electrode structure in which a pair of the positive and negative electrodes are provided on opposite surfaces, the electrode on the bottom surface is connected with one of the first inner lead 31c and the second inner lead 41c with a conductive adhesive, and the electrode on the top surface is connected with the other of the first inner lead 31c and the second inner lead 41c with the wire 63. One or a plurality of light emitting elements 61 may be mounted on one package 10. For example, three light emitting elements 61 of blue, green and red may be mounted on one package 10, or two light emitting elements 61 of blue and green may be mounted on one package 10.

In this embodiment, the light emitting element 61 is mounted on the first surface 50a of the first inner lead 31c and is connected with the first inner lead 31c and the second inner lead 41c with the wires 63.

The light emitting element 61 and the first inner lead 31c may be joined together with, for example, an adhesive. The adhesive may be used to join a protective element 62 described below and the second inner lead 41c with each other. Examples of insulating adhesive include epoxy resin, silicone resin, polyimide resin, modified resins thereof, and hybrid resins thereof, and the like. Examples of conductive adhesive include a conductive paste of silver, gold, palladium or the like, solder such as tin-bismuth-based solder, tin-copper-based solder, tin-silver-based solder or gold-tin-based solder, or the like.

Protective Element 62

The light emitting device 102 may include the protective element 62. The protective element 62 protects the light emitting element 61 against electrostatic charges and high voltage surge. Specifically, the protective element 62 may be, for example, a Zener diode. The protective element 62 is connected in parallel to the light emitting element 61, and thus can improve the reliability of the light emitting device 102. In this embodiment, the protective element 62 includes terminals on a top surface and a bottom surface thereof, and is mounted on the second inner lead 41c. The terminal on the top surface of the protective element 62 is electrically connected with the first inner lead 31c with a wire 63. The terminal on the bottom surface of the protective element 62 is electrically connected with the second inner lead 41c, on which the protective element 62 is located.

Wires 63

Each of the wires 63 is a conductive line. The wires 63 are respectively used to connect the electrodes of the light emitting element 61 and the first and second inner leads 31c and 41c to each other. The wires 63 may be a metal line formed of a metal material such as gold, copper, silver, platinum, aluminum, palladium or the like, or an alloy thereof. The wires 63 is also used to connect the protective element 62 and the first inner lead 31c to each other.

Protective Layer 65

In the case in which the first surface 50a of the lead frame 50 is formed of silver or a silver alloy, it is preferred that the light emitting device 102 includes the protective layer 65. For example, as shown in FIG. 5B, the protective layer 65 covers the first surface 50a of the first inner lead 31c and the first surface 50a of the second inner lead 41c. With such an arrangement, the first surfaces 50a of the first inner lead 31c and the first surface 50a of the second inner lead 41c can be protected against external environments and the like, and are suppressed from being discolored or corroded by sulfidation. By preventing or inhibiting corrosion of the first inner lead 31c and/or the second inner lead 41c, the wires 63 are less likely to be broken. As described below, in the case in which the recessed portion 20r is filled with the encapsulant 70 containing a potassium fluorosilicate-based phosphor as a phosphor material, it is preferred that the first surface 50a of the first inner lead 31c and the first surface 50a of the second inner lead 41c structuring the bottom surface 20b of the recessed portion 20r are covered with the protective layer 65. With such an arrangement, fluorine, which is generated as a result of reaction of the potassium fluorosilicate-based phosphor with moisture or the like, reacts with the metal (especially, silver or a silver alloy) on the first surface 50a of the first inner lead 31c and/or the second inner lead 41c, and thus decreases the probability that the first surface 50a is corroded.

The protective layer 65 may cover a portion of the light emitting element 61 and a portion of the resin molded body 20 a light output surface 61a of the light emitting element 61 or the inner side surfaces of the recessed portion 20r of the package 10. For example, as shown in FIG. 5C, the protective layer 65 is formed on portions among the light output surface 61a of the light emitting element 61, the inner side surfaces of the recessed portion 20r and the first surfaces 50a of the first inner lead 31c and the second inner lead 41c; more specifically, the protective layer 65 is formed on a portion exposed to the bottom surface 20b of the recessed portion 20r. Although not shown in figures, surfaces of the wires 63 may be covered with the protective layer 65. With such an arrangement, protection can be provided to the light output surface 61a of the light emitting element 61, and the first surfaces 50a of the first inner lead 31c and the second inner lead 41c, and the like.

The protective layer 65 may be a film of an organic material such as a resin or the like. The protective layer 65 is preferably a film of an inorganic material, and is more preferably a film of a non-metal material, from the points of view of heat resistance and light resistance. The protective layer 65 may be a conductive film, but is preferably an electrically insulating film in order to avoid unintentional short-circuiting. In the case in which the protective layer 65 is an electrically insulating film, at least a portion of the first outer lead 31d and at least a portion of the second outer lead 41d are exposed from the protective layer 65. With such a structure, electric power can be supplied from the first outer lead 31d and the second outer lead 41d.

The protective layer 65 may be formed of, for example, an oxide, a nitride, an oxynitride, a fluoride or the like of a metal material or silicon. More specifically, the protective layer 65 is preferably formed of an oxide, a nitride or an oxynitride of at least one of silicon, aluminum, gallium, niobium, tantalum, yttrium and hafnium. Alternatively, the protective layer 65 is preferably formed of a fluoride of at least one of magnesium, calcium, barium and lithium. Especially, the protective layer 65 is preferably formed of an oxide, a nitride or an oxynitride of at least one of silicon and aluminum due to its high light-transmissivity and relatively high gas barrier property.

The protective layer 65 may be of a single-film structure or a multi-film structure. In the case in which a multi-film structure is adopted, the gas barrier property is further increased. The thickness of the protective layer 65 is appropriately selectable, and is preferably in a range of from 1 nm to 1000 nm, more preferably in a range of from 5 nm 500 nm, and still more preferably in a range of from 10 nm to 100 nm, from the points of view of gas barrier property and light transmittance. The protective layer 65 may be formed by, for example, at least one of sputtering, vapor deposition, atomic layer deposition, printing, and atomization. Among these methods, sputtering is preferred from the points of view of mass-productivity and film quality. Atomic layer deposition is preferred because a film that is fine and has a high gas barrier property is easily formed.

Encapsulant 70

The light emitting device 102 may include the encapsulant 70 provided in the recessed portion 20r of the package 10. The encapsulant 70 encapsulates the light emitting element 61, and protects the light emitting element 61 against dust, moisture, an external force, or the like. The provision of the encapsulant 70 allows the components such as the light emitting element 61 and the like to be protected, and improves the reliability of the light emitting device 102. The encapsulant 70 is provided in the recessed portion 20r. A surface of the encapsulant 70 may be at substantially the same level as, or recessed from, the front surface 20a of the resin molded body 20. The encapsulant 70 merely needs to be electrically insulating and transmissive to light emitted from the light emitting element 61, which preferably has a light transmissivity of 60% or greater at the light emission peak wavelength of the light emitting element 61. The encapsulant 70 preferably contains at least a phosphor material in a base material, but is not limited to this.

The base material of the encapsulant 70 may be silicone resin, epoxy resin, phenol resin, polycarbonate resin, acrylic resin, TPX resin, polynorbornene resin, modified resins thereof, or hybrid resins thereof. Among these resins, silicone-based resin (including silicone-based resins, modified resins thereof, and hybrid resins thereof) is preferred due to high resistance to heat and light. Phenyl group-containing silicone-based resin (i.e., resins in the range from methylphenolsilicone-based resin to diphenylsilicone-based resin) is preferred relatively high in heat resistance and gas barrier property among silicone-based resins. The content of the phenyl group with respect to all the organic groups bonded to the silicon atom in the phenyl group-containing silicone-based resin is, for example, in a range of from 5 mol % to 80 mol %, preferably in a range of from 20 mol % to 70 mol %, and more preferably in a range of from 30 mol % to 60 mol %. The phenyl group-containing silicone-based resin is relatively hard, and therefore, can support the resin molded body 20 when being provided in the recessed portion 20r. This decreases the probability that the resin molded body 20 is broken.

Phosphor Substance

The light emitting device 102 may contain a phosphor material in the encapsulant 70. The phosphor material absorbs at least a portion of primary light emitted from the light emitting element 61, and emits secondary light having a different wavelength from that of the primary light. Thus, the light emitting device 102 emits mixed light (e.g., white light) of the primary light and the secondary light, which are of a wavelength of visible light. As the phosphor material, one or a combination of the specific examples described below may be used. Specific examples of the phosphor material emitting green light to yellow light include a yttrium-aluminum-garnet-based phosphor material (e.g., $Y_3(Al,Ga)_5O_{12}$:Ce), a lutetium-aluminum-garnet-based phosphor material (e.g., $Lu_3(Al,Ga)_5O_{12}$:Ce), a silicate-based phosphor material (e.g., $(Ba,Sr)_2SiO_4$:Eu), a chloro-silicate-based phosphor material (e.g., $Ca_8Mg(SiO_4)_4Cl_2$:Eu), a β sialon-based phosphor material (e.g., $Si_{6-z}Al_zO_zN_{8-z}$:Eu (0<Z<4.2)), and the like. Specific examples of the phosphor material emitting red light include a nitrogen-containing calcium aluminosilicate (CASN or SCASN)-based phosphor material (e.g., $(Sr,Ca)AlSiN_3$:Eu), and a manganese-activated potassium fluorosilicate-based phosphor material (e.g., $K_2SiF_6$:Mn). The phosphor material may contain a quantum dot. A quantum dot is a particle having a diameter of in a range of from about 1 nm to 100 nm, and may change the light emission wavelength in accordance with the diameter thereof. In the case in which a potassium fluorosilicate-based phosphor material having a low water-proofness is used, it is preferred that the phosphor material is localized in the encapsulant 70, at a position close to the bottom surface 20b of the recessed portion 20r, namely, in the vicinity of the first inner lead 31c and the second inner lead 41c, in order to avoid the influence of moisture outside the light emitting device 102.

A filler for the encapsulant 70 may be silicon oxide, aluminum oxide, zirconium oxide, zinc oxide or the like. As the filler for the encapsulant 70, one or a combination of two or more of the above-listed substances may be used. As an agent for decreasing the thermal expansion coefficient of the encapsulant 70, silicon oxide is especially preferred.

The second end surface 31de and the second end surface 41de face the second outer side surface 22f side in the y-axis direction of the second lateral wall 22, which is a top surface of the light emitting device 102. The second end surface 31de and the second end surface 41de are not covered with the plating layer 51. The light emitting device 102 mainly outgoes the light from the light emitting element 61 toward the front surface 20a in the z-axis direction. The first end surface 31df of the first lead electrode 31 and the second end surface 41df of the second lead electrode 41, which face the front surface 20a side, are covered with the plating layer 51. In other words, the plated end surfaces of the first lead electrode 31 and the second lead electrode 41 face the surface side of the light emitting device 102 from which the light outgoes. With such a structure, if the reflectance of the plating layer 51 at the peak wavelength of the light emitting element 61 is higher than the reflectance of the base member of the lead frame 50 with respect to the peak wavelength of the light emitting element 61, light entering the light guide plate can be increased. For example, in the case in which the light emitting device 102 is used as a backlight unit, even if the light emitted from the light emitting device 102 is reflected by the light guide plate, and returns to the light emitting device 102, such reflected light is reflected again by the highly reflective plating layer 51 covering the first end surfaces 31df and 41df of the first lead electrode 31 and the second lead electrode 41, and re-enters the light guide plate.

Method of Producing Light Emitting Device 102

A method of producing the light emitting device 102 in an embodiment according to the present disclosure will be described. FIG. 7A through FIG. 7I are each a schematic front view illustrating a step of the method of producing the light emitting device 102. The method of producing the light emitting device 102 includes a step of providing the light emitting device mounting board block 101, a step of mounting the light emitting element 61, and a step of cutting the lead frame 50. Hereinafter, each of the steps will be described in detail.

Step of Preparing Light Emitting Device Mounting Board Block 101

The light emitting device mounting board block 101 shown in FIG. 1 is provided. The light emitting device mounting board block 101 includes the plurality of package members 10', each of which is to become the package 10 of the light emitting device 102. As described above with reference to FIG. 1 and the like, the light emitting device mounting board block 101 includes the lead frame 50 and the plurality of resin molded bodies 20. The light emitting device mounting board block 101 may be formed as follows. On the lead frame 50 including the shapes shown in FIG. 5A and FIG. 5B at a plurality of positions, the resin molded bodies 20 are formed by transfer molding, injection molding, compression molding or the like. Alternatively, a ready-made light emitting device mounting board block 101 may be purchased.

Step of Mounting Light Emitting Element 61

Figure 7A:
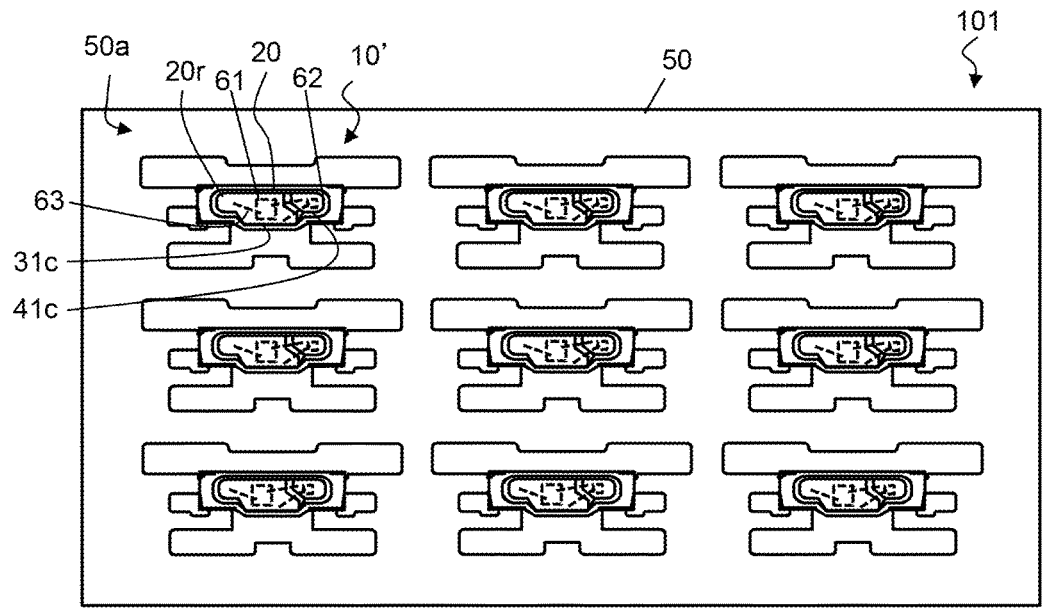
FIG. 7A is a front view illustrating a step of a method of producing the light emitting device.

As shown in FIG. 7A, the light emitting element 61 is mounted in the recessed portion 20r of each resin molded body 20. For example, in the recessed portion 20r, the light emitting element 61 is mounted on the first surface 50a of the first inner lead 31c. Then, the electrodes of the light emitting element 61 are respectively connected with the first inner lead 31c and the second inner lead 41c by the wires 63. As necessary, the protective element 62 may be mounted on the first surface 50a of the second inner lead 41c, and may be connected with the first inner lead 31c by the wire 63.

Step of Forming Protective Layer 65

Figure 7B:
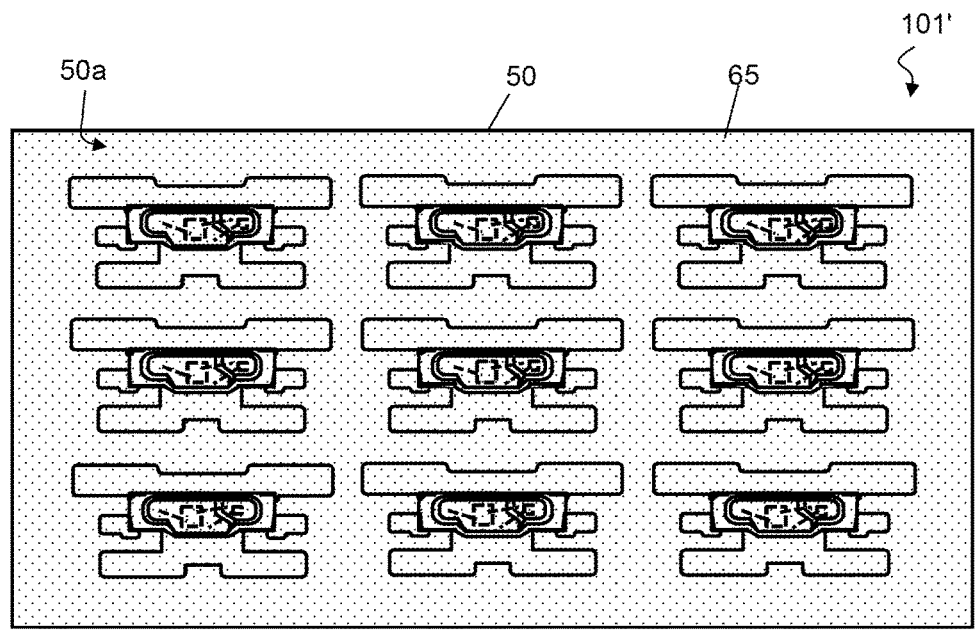
FIG. 7B is a front view illustrating a step of the method of producing the light emitting device.

In the case in which the light emitting device 102 includes the protective layer 65, after the light emitting element 61 is mounted, the protective layer 65 is formed. As shown in FIG. 7B, the protective layer 65 (represented by hatching) is formed on the first surface 50a of a light emitting device mounting board block 101' on which the light emitting element 61 are mounted, by, for example, sputtering, vapor deposition, atomic layer deposition, printing, atomization or the like. Specifically, the protective layer 65 is preferably formed by sputtering. By employing sputtering, the protective layer 65 can be formed on the first surface 50a of the lead frame 50 but substantially not on the second surface 50b of the lead frame 50. With such a structure, even if the protective layer 65 is made of an insulating material, electric power may be supplied from the second surface 50b of the lead frame 50. In this embodiment, the second surface 50b of the lead frame 50 forms a bottom surface of the light emitting device 102. In the case in which the protective layer 65 made of an insulating material is formed by vapor deposition, atomic layer deposition or the like, a mask may be used such that the protective layer 65 is not formed on the second surface 50b of the lead frame 50. Alternatively, after the protective layer 65 is formed, a portion of the protective layer 65 unintentionally formed on the second surface 50b of the lead frame 50 may be removed by polishing, etching or the like. In this manner, even if an insulating material is used for the protective layer 65, electric power is supplied from second surface 50b of the lead frame 50.

Step of Locating the Encapsulant 70

Figure 7C:
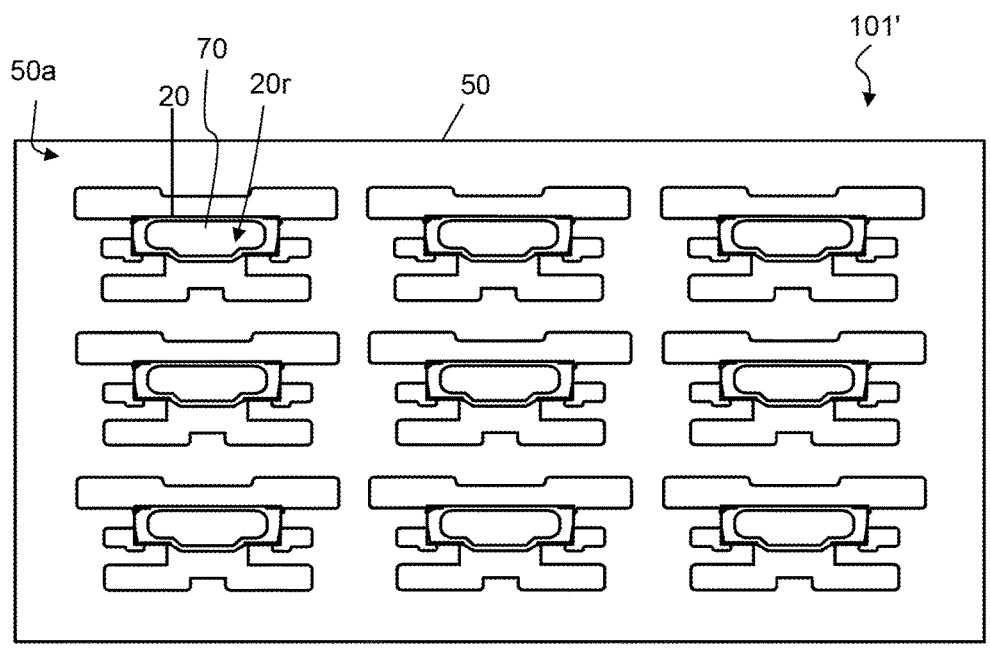
FIG. 7C is a front view illustrating a step of the method of producing the light emitting device.

In the case in which the light emitting device 102 includes the encapsulant 70, after the protective layer 65 is formed, the encapsulant 70 is provided in the recessed portion 20r of the resin molded body 20 as shown in FIG. 7C.

Step of Cutting Lead Frame 50

The lead frame 50 is cut at the first connection position C1, at which the second portion 31d2 of the first outer lead 31d and the frame 50c are connected with each other, and at the second connection position C2, at which the fourth portion 41d2 of the second outer lead 41d and the frame 50c are connected with each other.

Figure 7D:
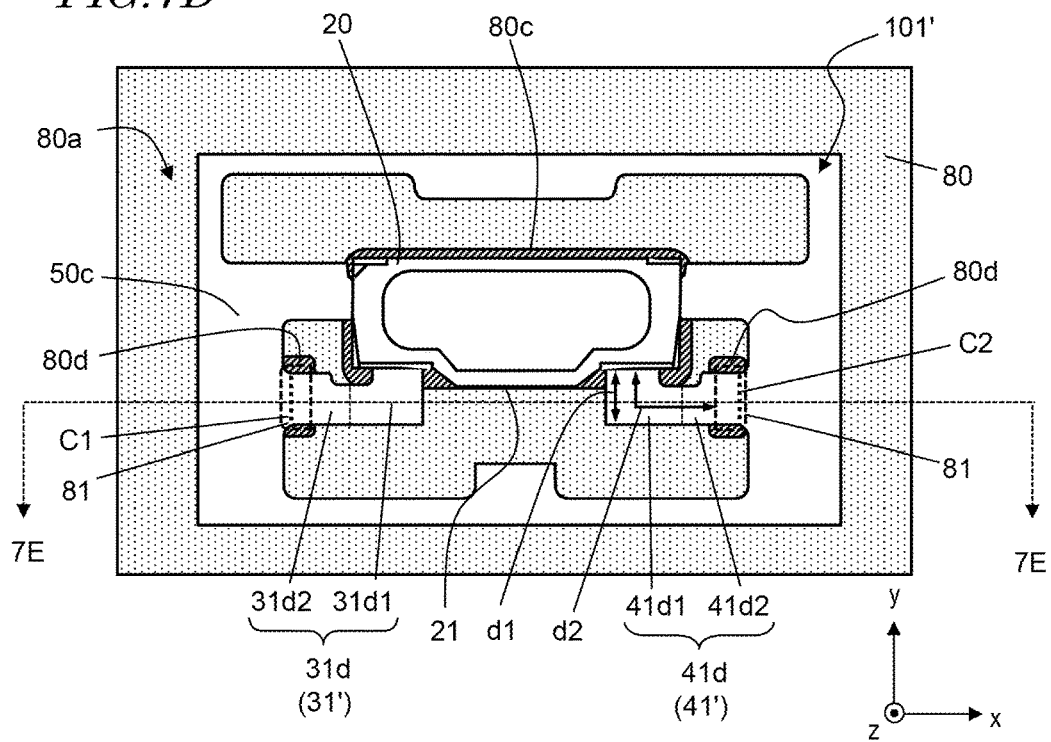
FIG. 7D is a front view illustrating a step of the method of producing the light emitting device.
Figure 7E:
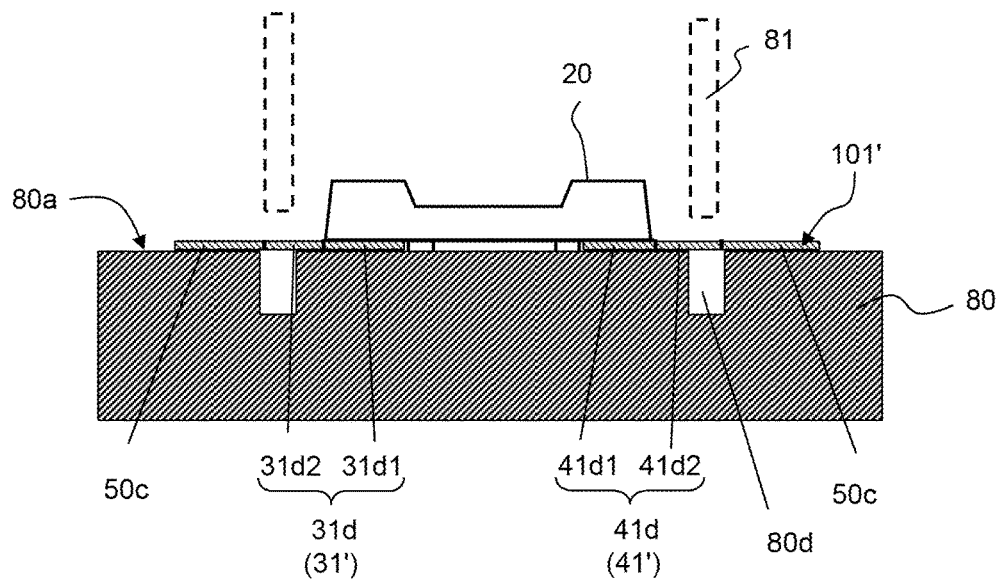
FIG. 7E is a cross-sectional view taken along line 7E-7E in FIG. 7D, illustrating a step of the method of producing the light emitting device.

The lead frame 50 may be cut by, for example, pressing. As shown in FIG. 7D, a die plate (i.e., support member) 80 having a top surface 80a with a hole 80c and holes 80d is provided. FIG. 7E is a cross-sectional view of the die plate 80 taken along line 7E-7E in FIG. 7D. The hole 80c has such a shape that is capable of accommodating a portion of the resin molded body 20. The holes 80d receive a punch (i.e., pressing mold) 81 used to punch the lead frame 50 at the first connection position C1 and the second connection position C2. As shown in FIG. 7D and FIG. 7E, the light emitting device mounting board block 101' is located on the top surface 80a at a position where the portion of the resin molded body 20 is inserted into the hole 80c. In the case in which the light emitting device mounting board block 101' includes the plurality of package members 10', the lead frame 50 may be cut at a plurality of the first connection positions C1 and a plurality of the second connection positions C2 simultaneously. The holes 80d may be through-holes.

The die plate 80 is a support member supporting the lead frame 50 of the light emitting device mounting board block 101'. At least a portion of each of the first portion 31d1 and the second portion 31d2 of the first outer lead 31d is in contact with the top surface 80a of the die plate 80, and a portion of each of the third portion 41d1 and the fourth portion 41d2 of the second outer lead 41d is in contact with the top surface 80a of the die plate 80. Thus, the die plate 80 supports the first portion 31d1, the second portion 31d2, the third portion 41d1 and the fourth portion 41d2. The die plate 80 is a bottom molding die. Although not shown in figures, another die plate acting as a top molding die having substantially the same structure as that of the die plate 80 is provided, and the lead frame 50 is held between the two die plates.

Figure 7F:
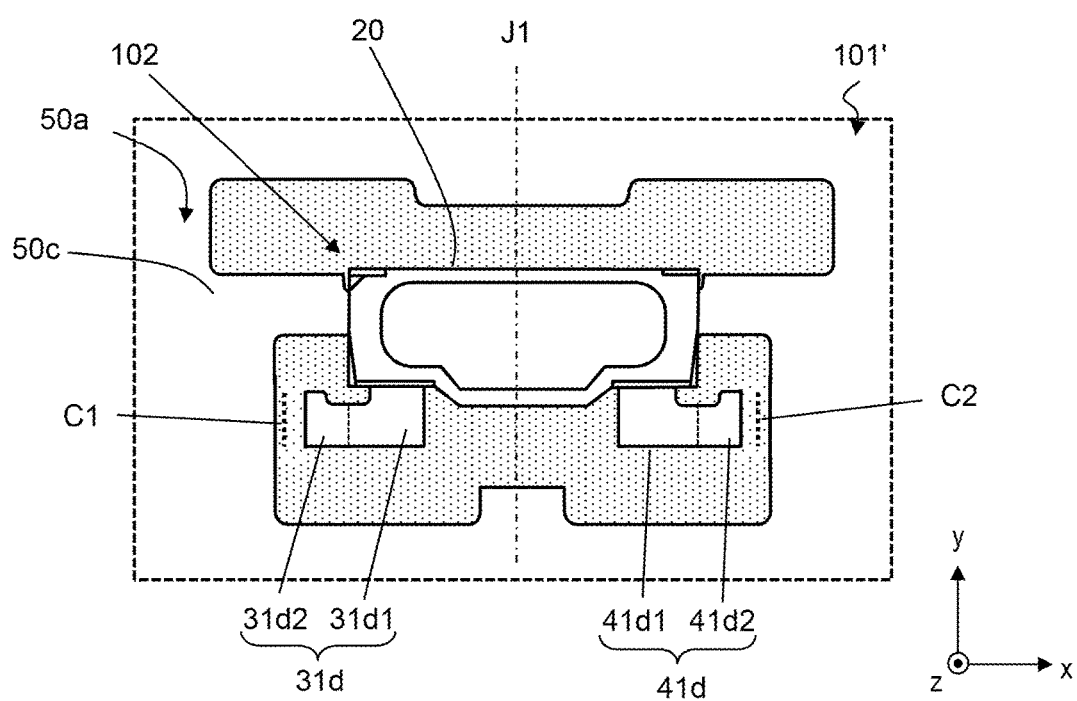
FIG. 7F is a front view illustrating a step of the method of producing the light emitting device.

As shown in FIG. 7D and FIG. 7E, a punch 81 represented by the dashed line is pressed down to punch out a portion of the second portion 31d2 of the first outer lead 31d (including the first connection position C1) and a portion of the fourth portion 41d2 of the second outer lead 41d (including the second connection position C2). As a result, as shown in FIG. 7F, the portion of the second portion 31d2 of the first outer lead 31d and the portion of the fourth portion 41d2 of the second outer lead 41d are cut away from the frame 50c.

The first connection position C1 and the second connection position C2 are located outer to the resin molded body 20 in the length direction. Therefore, in the region outer to the resin molded body 20 in the length direction, the portion of the second portion 32d2 of the first outer lead 31d and the portion of the fourth portion 42d2 of the second outer lead 41d are punched out by the punch 81. A length d1 is a length of short side direction of each of the first outer lead 31d and the second outer lead 41d. A distance d2 is a distance between the first lateral wall 21 of the resin molded body 20 and each of the regions to be punched out of the first outer lead 31d and the second outer lead 41d. In this embodiment, even if the length d1 is shortened by shortening the depth of the light emitting device 102, the distance d2 can be securely long, because the second portion 31d2 and the fourth portion 41d2 are located between the first lateral wall 21 and the regions to be punched out. Therefore, the two die plates hold the first portion 31d1, the third portion 41d1, the second portion 31d2 and the fourth portion 41d2 therebetween to support the portions stably. Accordingly, the displacement of the first outer lead 31d and the second outer lead 41d is less likely to occur when the portion of the second portion 31d2 of the first outer lead 31d and the portion of the fourth portion 41d2 of the second outer lead 41d are punched out. In consequence, the resin molded body 20 can be stably supported without occurrence of displacement.

Step of Bending First Outer Lead 31d and Second Outer Leads 41d

The first outer lead 31d and the second outer leads 41d are bent.

Figure 7G:
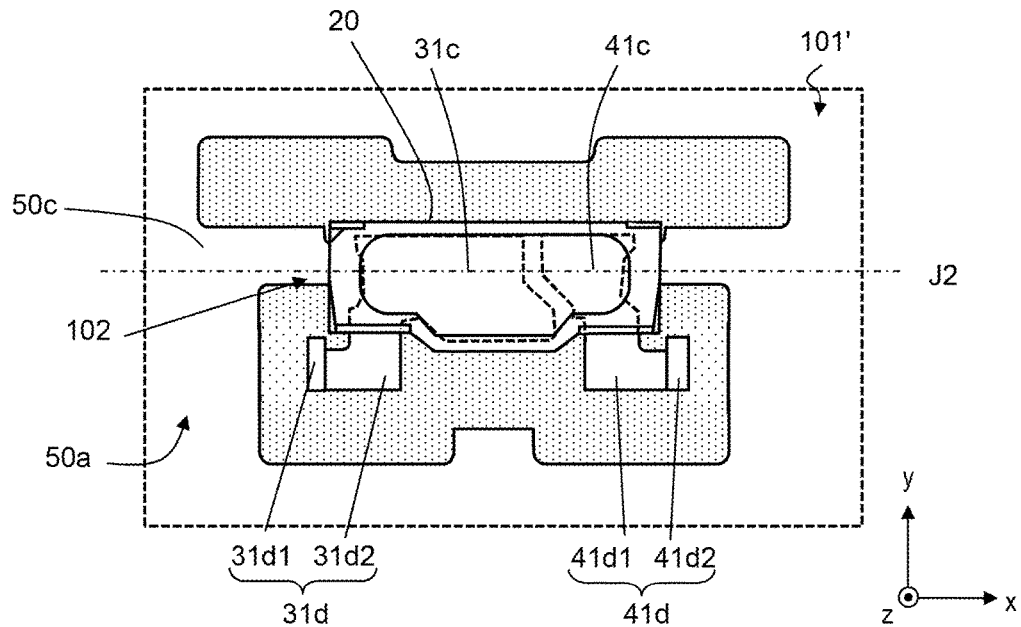
FIG. 7G is a front view illustrating a step of the method of producing the light emitting device.
Figure 7H:
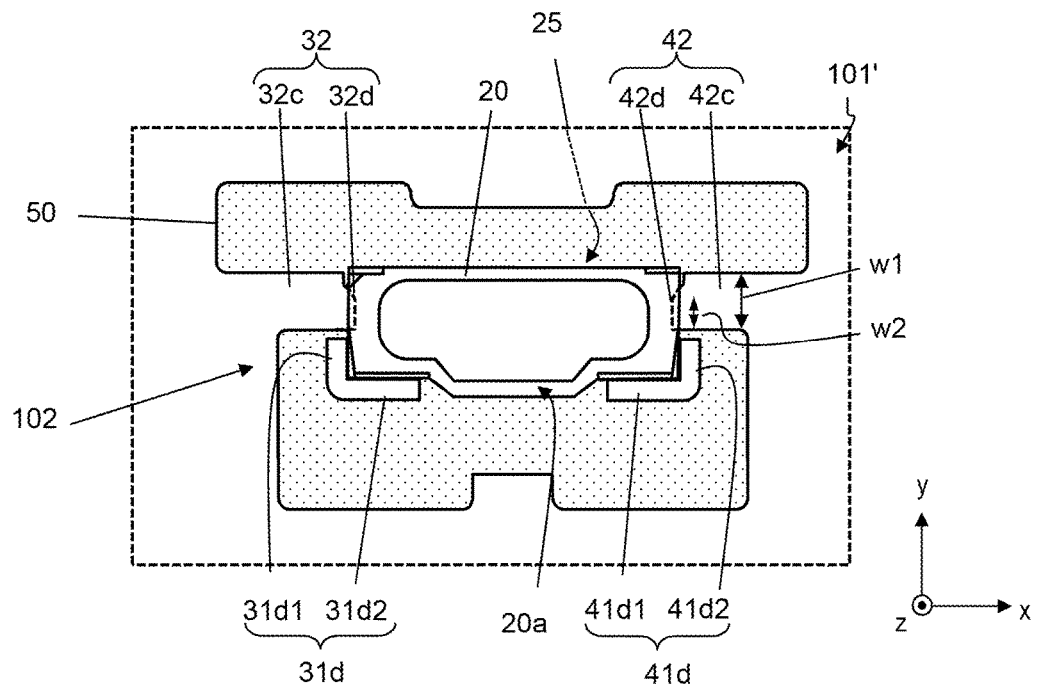
FIG. 7H is a front view illustrating a step of the method of producing the light emitting device.

As shown in FIG. 7F, the second portion 31d2 and the fourth portion 41d2 are bent toward a central axis J1 in the length direction on the side of the first surface 50a, such that a bent portion (i.e., bending line) is formed between the first portion 31d1 and the second portion 31d2 of the first outer lead 31d and between the third portion 41d1 and the fourth portion 41d2 of the second outer lead 41d. As a result, as shown in FIG. 7G, the first portion 31d1 and the second portion 31d2 define an angle of about 90 degrees with respect to each other, and the third portion 41d1 and the fourth portion 41d2 define an angle of about 90 degrees with respect to each other.

The first portion 31d1 and the third portion 41d1 are bent toward a central axis J2 in the width direction on the side of the first surface 50a, such that a bent portion (bending line) is formed between the first portion 31d1 of the first outer lead 31d and the first inner lead 31c and between the third portion 41d1 of the second outer lead 41d and the second inner lead 41c. As a result, as shown in FIG. 7I, the first surface 50a of the first portion 31d1, the second portion 31d2, the third portion 41d1 and the fourth portion 41d2 faces the resin molded body 20. In this manner, the light emitting device 102 is produced. In this state, the light emitting device 102 is supported by the lead frame 50 by the first support lead 32 and the second support lead 42.

Step of Detachment

The light emitting device 102 is detached from the lead frame 50. For example, a pin or the like is put into contact with the first support lead 32 and/or the second support lead 42, and is pushed toward the front surface 20a. Accordingly, the protrusion portion 32d of the first support lead 32 and the protrusion portion 42d of the second support lead 42 are detached from the resin molded body 20, and thus the light emitting device 102 is detached from the lead frame 50. As a result of the detachment of the protrusion portion 32d and the protrusion portion 42d, as shown in FIG. 5A, the third recessed portion 23r is formed in the third outer side surface 23f, and the fourth recessed portion 24r is formed in the fourth outer side surface 24f.

As shown in FIG. 7I, the base portions 32c and 42c each have width w1 in the width direction, and the protrusion portions 32d and 42d each have width w2 in the width direction. Width w2 is smaller than width w1. Therefore, each of regions, where the first support lead 32 and the second support lead 42 are in contact with the resin molded body 20, is small, and thus the stress received by the resin molded body 20 from the first support lead 32 and the second support lead 42 at the time of detaching the protrusion portions 32d and 42d from the resin molded body 20 can made small. In contrast, width w1 of each of the base portion 32c of the first support lead 32 and the base portion 42c of the second support lead 42 is relatively large.

Therefore, for the period from the step of cutting the lead frame 50 until the light emitting device 102 is detached from the lead frame 50, the first support lead 32 and the second support lead 42 stably support the resin molded body 20. This, for example, can improve the processing precision of the step of bending the first outer lead 31d and the second outer lead and 41d. In addition, the position or the orientation of the resin molded body 20 is not made inappropriate, and therefore, occurrence of a bending fault can be reduced.

As described above, according to the method of producing the light emitting device 102 in this embodiment, the first connection position C1 and the second connection position C2, at which the first lead electrode portion 31' and the second lead electrode portion 41' are connected with the frame 50c of the lead frame 50, are located outside of the resin molded body 20 in the length direction. Therefore, even if the length in the width direction of each of the first outer lead 31d and the second outer lead 41d is shortened, the distance from the first lateral wall 21 of the resin molded body 20 to each of the first connection position C1 and the second connection position C2 can be long. Accordingly, the die plates can easily support the first outer lead 31d and the second outer lead 41d. Therefore, the light emitting device 102 having a short depth is produced. The length in the width direction of each of the first outer lead 31d and the second outer lead 41d is shortened. Therefore, regardless of whether the first outer lead 31d and the second outer lead 41d are bent such that the first surfaces 50a thereof face the first outer side surface 21, or the first outer lead 31d and the second outer lead 41d are bent such that the second surfaces 50b thereof face the first outer side surface 21, the light emitting device 102 having a short depth can be produced.

The light emitting device according to the present disclosure can be suitably used as a thin light emitting device for various applications such as backlight for display of liquid crystal display.

While exemplary embodiments of the present invention have been described, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A light emitting device mounting board block comprising:
    a lead frame having a plate-shape, the lead frame having a first surface, and a second surface located opposite to the first surface; and
    a resin molded body located on the first surface of the lead frame, the resin molded body having a recessed portion therein;
    wherein:
    the resin molded body comprises a first lateral wall, a second lateral wall, a third lateral wall and a fourth lateral wall, the first and second lateral walls extending in a length direction, the third and fourth lateral walls extending in a width direction;
    the recessed portion is enclosed by the first, second, third and fourth lateral walls;
    the lead frame comprises a first support lead partially embedded in the third lateral wall, a first inner lead partially exposed from the resin molded body at a bottom surface of the recessed portion, a first outer lead connected with the first inner lead and extending from the first lateral wall, and a frame connected with the first support lead and the first outer lead; and
    the first outer lead comprises a first portion extending from the first lateral wall in the width direction, and a second portion connected with the first portion and extending in the length direction to be connected with the frame.

2. The light emitting device mounting board block according to claim 1, wherein:
    the lead frame comprises a second support lead partially embedded in the fourth lateral wall, a second inner lead partially exposed from the resin molded body at the bottom surface of the recessed portion, and a second outer lead connected with the second inner lead and extending from the first lateral wall;
    the second support lead and the second outer lead are connected with the frame; and
    the second outer lead comprises a third portion extending from the first lateral wall in the width direction, and a fourth portion connected with the third portion and extending in the length direction to be connected with the frame.

3. The light emitting device mounting board block according to claim 2, wherein a distance between a first connection position at which the second portion of the first outer lead is connected with the frame and a second connection position at which the fourth portion of the second outer lead is connected with the frame, is longer than a distance between an end of the first support lead embedded in the third lateral wall and an end of the second support lead embedded in the fourth lateral wall.

4. The light emitting device mounting board block according to claim 1, wherein:
    the first support lead extends in the length direction;
    the first support lead comprises a base portion having a width w1 in the width direction, and a protrusion portion located at a tip of the base portion on a first outer lead side in the width direction, the protrusion portion having a width w2 shorter than the width w1; and
    a portion of the protrusion portion is embedded in the third lateral wall.

5. The light emitting device mounting board block according to claim 1, wherein the first surface of the first inner lead has a first groove therein.

6. The light emitting device mounting board block according to claim 1, wherein the second surface of the first inner lead has a second groove therein.

7. The light emitting device mounting board block according to claim 1, further comprising a light emitting element located on the first surface of the first inner lead.

8. The light emitting device mounting board block according to claim 1, further comprising a protective layer covering the first surface of the lead frame and a portion of the resin molded body.

9. A method of producing a light emitting device, the method comprising steps of:
    providing a light emitting device mounting board block comprising:
    a lead frame having plate-shape, the lead frame having a first surface, and a second surface located opposite to the first surface; and
    a resin molded body located on the first surface of the lead frame, the resin molded body having a recessed portion therein;

wherein:
the resin molded body comprises a first lateral wall and a second lateral wall extending in a length direction, and a third lateral wall and a fourth lateral wall extending in a width direction;
the recessed portion is enclosed by the first lateral wall, the second lateral wall, the third wall and the fourth lateral wall;
the lead frame comprises a first support lead partially embedded in the third lateral wall, a first inner lead partially exposed from the resin molded body at a bottom surface of the recessed portion, a first outer lead connected with the first inner lead and extending from the first lateral wall, and a frame connected with the first support lead and the first outer lead; and
the first outer lead comprises a first portion extending from the first lateral wall in the width direction, and a second portion connected with the first portion and extending in the length direction to be connected with the frame;
mounting a light emitting element on the first surface of the first inner lead; and
locating a support member supporting the first portion and the second portion of the first outer lead in such a manner as to be in contact with at least a portion of each of the first portion and the second portion of the first outer lead, and cutting the lead frame at a first connection position at which the second portion of the first outer lead is connected with the frame.

10. The method of producing a light emitting device according to claim 9, further comprising, after the step of mounting the light emitting element, forming a protective layer covering the first surface of the lead frame, a portion of the resin molded body and a portion of the light emitting element.

11. The method of producing a light emitting device according to claim 10, wherein the protective layer is formed by sputtering.

12. The method of producing a light emitting device according to claim 9, further comprising after the step of cutting the lead frame at the first connection position, bending the first outer lead between the first inner lead and the first portion of the first outer lead, and between the first portion and the second portion of the first outer lead, such that the first surface faces the resin molded body.

13. A light emitting device comprising:
a package comprising:
a first lead electrode having a first surface, and a second surface located opposite to the first surface,
a plating layer covering the first surface and the second surface of the first lead electrode, and
a resin molded body located on the first surface of the first lead electrode, the resin molded body having a recessed portion therein; and
a light emitting element located in the recessed portion of the package;
wherein:
the resin molded body comprises a first lateral wall, a second lateral wall, third lateral wall, a fourth lateral wall, and a third surface, the first and second lateral walls extending in a length direction, the third and fourth lateral walls extending in a width direction, the third surface having an opening of the recessed portion formed therein;
the recessed portion is enclosed by the first, second, third and fourth lateral walls;
the first lead electrode comprises a first inner lead partially exposed from the resin molded body at a bottom surface of the recessed portion, and a first outer lead connected with the first inner lead and extending from the first lateral wall; and
the first outer lead comprises a first portion facing the first lateral wall, and a second portion facing the third lateral wall; and
the second portion of the first outer lead has:
a first end surface facing in a same direction as an outer side surface of the third lateral wall, the first end surface being covered with the plating layer, and
a second end surface facing in a same direction as an outer side surface of the second lateral wall, the second end surface being exposed from the plating layer.

14. The light emitting element according to claim 13, further comprising a protective layer covering the first surface of the first lead electrode, a portion of the resin molded body, and a portion of the light emitting element.

15. The light emitting device according to claim 14, wherein the protective layer covers the first portion and the second portion of the first outer lead.

16. The light emitting element according to claim 13, further comprising a encapsulant in the recessed portion, the encapsulant containing a phosphor material.

17. The light emitting element according to claim 13, wherein the resin molded body has a second recessed portion provided in the third lateral wall, the second recessed portion being away from the first lateral wall and the second lateral wall.

* * * * *